(12) United States Patent
Shaik et al.

(10) Patent No.: US 11,176,991 B1
(45) Date of Patent: Nov. 16, 2021

(54) COMPUTE-IN-MEMORY (CIM) EMPLOYING LOW-POWER CIM CIRCUITS EMPLOYING STATIC RANDOM ACCESS MEMORY (SRAM) BIT CELLS, PARTICULARLY FOR MULTIPLY-AND-ACCUMLUATE (MAC) OPERATIONS

(71) Applicant: QUALCOMM Incorporated, San Diego, CA (US)

(72) Inventors: Khaja Ahmad Shaik, Cork (IE); Bharani Chava, Cork City (IE); Dawuth Shadulkhan Pathan, Bengaluru (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/084,779

(22) Filed: Oct. 30, 2020

(51) Int. Cl.
| | |
|---|---|
| G11C 7/00 | (2006.01) |
| G11C 11/4094 | (2006.01) |
| G11C 11/4096 | (2006.01) |
| G11C 5/06 | (2006.01) |
| G11C 11/4074 | (2006.01) |
| G11C 11/404 | (2006.01) |

(52) U.S. Cl.
CPC ............ G11C 11/4094 (2013.01); G11C 5/06 (2013.01); G11C 11/4045 (2013.01); G11C 11/4074 (2013.01); G11C 11/4096 (2013.01)

(58) Field of Classification Search
CPC ... G11C 11/4094; G11C 5/06; G11C 11/4045; G11C 11/4074; G11C 11/4096
USPC .......................................................... 365/203
See application file for complete search history.

(56) References Cited

U.S. PATENT DOCUMENTS

2019/0088310 A1\* 3/2019 Li ...................... G11C 7/1006

\* cited by examiner

*Primary Examiner* — Huan Hoang
(74) *Attorney, Agent, or Firm* — Qualcomm Incorporated

(57) ABSTRACT

Low-power compute-in-memory (CIM) systems employing CIM circuits that include static random access memory (SRAM) bit cells circuits. The CIM circuits can be used for multiply-and-accumulate (MAC) operations. The CIM circuits can include five-transistor (5T) SRAM bit cells that each have a single bit line coupled to an access circuit for accessing the SRAM bit cell for read/write operations. The CIM circuit also includes a multiplication circuit (e.g., an exclusive OR (XOR)-based circuit) coupled to the SRAM bit cell. The CIM circuit is configured to perform multiplication of an input data value received by the multiplication circuit with a weight data value stored in the SRAM bit cell. The reduction of an access circuit in the 5T SRAM bit cell allows the pull-up voltage at a supply voltage rail coupled to the inverters of the 5T SRAM bit cell to be reduced to reduce standby power while providing storage stability.

27 Claims, 10 Drawing Sheets

200

| INPUT X | INPUT Y | XNOR OUTPUT (202) |
|---|---|---|
| 0 | 0 | 1 |
| 0 | 1 | 0 |
| 1 | 0 | 0 |
| 1 | 1 | 1 |

FIG. 2

COMPUTE-IN-MEMORY (CIM) EMPLOYING LOW-POWER CIM CIRCUITS EMPLOYING STATIC RANDOM ACCESS MEMORY (SRAM) BIT CELLS, PARTICULARLY FOR MULTIPLY-AND-ACCUMLUATE (MAC) OPERATIONS

BACKGROUND

I. Field of the Disclosure

The technology of the disclosure relates generally to machine learning computing, and more particularly to computational compute-in-memory (CIM) circuits integrated with static random access memory (SRAM) cell circuits for machine learning computing.

II. Background

Machine learning is the ability of a computing device to progressively improve performance of a particular task. For example, machine-learning algorithms can use results from processing known data to "train" a computing device to process new data with a higher degree of accuracy. Neural networks are a framework in which machine-learning algorithms may be implemented. A neural network is modeled after the organization of a brain, with a plurality of nodes that each correspond to a brain synapse. Each node receives input signals representing input data from preceding nodes and generates an output that becomes an input signal to succeeding nodes. The nodes are organized in sequential layers such that, in a first processing stage, nodes of a first layer receive input data from an external source and generate an output that is provided to every node in a second layer. In a next processing stage, nodes of the second layer receive the outputs of each node in the first layer, and generate further outputs to be provided to every node in a third layer as the nodes in the first layer receive and process new external inputs, and so on in subsequent processing stages.

Within each node, each input signal is uniquely weighted by multiplying the numerical input signal by an associated numerical weight. The products corresponding to the weighted input signals representing weight data are summed to generate a node output. Together, these operations are known as a multiply-and-accumulate (MAC) operation. FIG. 1 is a block diagram representing the operation of a conventional node 100 that may be used in a neural network. In the node 100, each of the numerical input signals $X_0$-$X_M$ are received and multiplied by respective numerical weight data $W_0$-$W_M$ to generate products $P_0$-$P_M$. The numerical weight data $W_0$-$W_M$ is stored and reused by the node 100 in each processing stage. The numerical weight data $W_0$-$W_M$ may be updated in a machine-learning method using feedback based on a comparison of actual results to expected results when processing known data. The node 100 uses an accumulation or summation function to add the products $P_0$-$P_M$ together to generate a summation signal SUM. The conventional node 100 may include an additional step in which an "activation function" may be performed on the SUM signal to produce an OUTPUT signal from the node 100. However, the activation function is beyond the scope of this disclosure and is not discussed further herein.

The node 100 in FIG. 1 performs "M" multiply operations and a summation function at each processing stage as a new set of numerical input signals $X_0$-$X_M$ are provided. The number of operations performed by a processing device executing a neural network framework will depend on the number of external inputs to the neural network, the number of nodes in each layer, and the number of layers in the neural network. In large neural networks, the processing device must execute thousands of operations at each processing stage. When the numerical input signals and weights are high-precision floating-point values, a significant amount of processing time, power, and memory are required to perform the MAC operations, consuming a large amount of energy, much of which is dissipated as heat. In addition, large amounts of data must be transferred between memory and one or more processors performing the MAC operations, which can cause delays that increase the response time of an application. Thus, neural network applications executing on conventional processing devices may have very slow response times, occupy large amounts of memory, and cause battery-operated devices to discharge quickly.

It is desired to provide memory circuits in memory arrays in a memory system accessible by a processor to store weight data that can be efficiently multiplied by input data for performing MAC operations, including for machine learning applications.

SUMMARY OF THE DISCLOSURE

Aspects disclosed in the detailed description include low-power compute-in-memory (CIM) systems employing CIM circuits employing static random access memory (SRAM) bit cells. As a non-limiting example, the CIM circuits can be used for multiply-and-accumulate (MAC) operations, such as those employed in machine-learning applications. The CIM circuits each include a SRAM bit cell circuit that includes a storage circuit for storing data. Data can be read from the storage circuit of the SRAM bit cell circuit by pre-charging a bit line and activating an access circuit (e.g., an access transistor) coupled between the bit line and the storage circuit. Data can be written to the storage circuit of the SRAM bit cell circuit by asserting a voltage of the desired logic level on the bit line and activating the access circuit. In aspects disclosed herein, the CIM circuit can also perform a multiplication operation between input data and storage data in the storage circuit of the SRAM bit cell. In this regard, the CIM circuit includes a multiplication circuit coupled to the SRAM bit cell circuit. As examples, the multiplication circuit can be an exclusive OR (XOR)-based circuit configured to perform an XOR-based logic operation (e.g., an XOR or exclusive negative OR (XNOR) operation) to perform a multiplication operation. The CIM circuit is configured to perform multiplication of an input data on a received input signal in the multiplication circuit with a weight data from the storage data in the SRAM bit cell circuit. The CIM system can employ a large number of CIM circuits. Thus, it may be desired to reduce standby and/or dynamic power dissipation in the CIM circuits to reduce the overall power dissipation in the CIM system.

In this regard, in an exemplary aspect, the CIM system includes a bit line driver circuit configured to pre-charge a bit line coupled to a SRAM bit cell circuit of a CIM circuit for a read operation. Because the bit line driver circuit may be coupled to more than one CIM circuit, the access circuit of the SRAM bit cell circuit to be read is also activated so that the charge stored in the storage circuit can be passed through the access circuit to the bit line. To reduce dynamic power in read operations to the CIM circuit, the bit line driver circuit can be configured to pre-charge the bit line to a reduced pre-charge voltage. For example, the CIM system may be included in a processor-based system that includes other memory arrays that are powered by a memory domain supply voltage (e.g. $V_{DD}$) in a memory domain. The bit line driver circuit is configured to pre-charge the bit line to a reduced pre-charge voltage level (e.g., $V_{DD}/2$) from the voltage level of the memory domain supply voltage as an example. By reducing the pre-charge voltage on the bit line, dynamic power for a read operation to the CIM circuit is reduced. The voltage swings in pre-charging the bit line for read operations is also reduced, thereby further reducing dynamic power dissipated for read operations. However, reducing the bit line pre-charge voltage for a read operation can cause a read disturbance issue between the storage circuit and the access circuit of the SRAM bit cell. For example, in a complementary six-transistor (6T) SRAM bit cell circuit, a reduced bit line pre-charge voltage asserted on a bit line for a read operation may not cause a pull-down N-type field-effect transistor (FET) (NFET) in a inverter circuit reinforcing a stored logic '0' value to discharge fast enough to avoid a respective access circuit causing a charge build up on its storage node. This could cause a voltage flip on the complementary storage node.

Thus, in a further exemplary aspect, the SRAM bit cell circuit in the CIM circuit can be provided as a five-transistor (5T) SRAM bit cell circuit. The 5T SRAM bit cell includes a true inverter circuit cross-coupled to a complement inverter circuit. A single access circuit is coupled between a single bit line and the true inverter circuit. The 5T SRAM bit cell circuit eliminates a complement bit line and complement access circuit (e.g., a complement access transistor) coupled to the complement inverter circuit as compared to a 6T complement SRAM bit cell circuit. By eliminating the complement access circuit in the 5T SRAM bit cell circuit of the CIM circuit, a contention that could exist between a complement access circuit and a complement inverter circuit in the 5T SRAM bit cell circuit from charging the bit line to a reduced pre-charge voltage in a read operation is reduced or avoided. Also by eliminating a complement bit line and complement access transistor in the 5T SRAM bit cell circuit of the CIM circuit, dynamic and standby power of the CIM circuit can be further reduced.

A bit line and complement bit line are provided in a 6T SRAM bit cell to provide differential voltages between a bit line and complement bit line to accomplish a high read sensitivity for a read operation that may not be required in the CIM circuit. Highly accurate read sensing may not be as important in applications that employ the CIM circuit as memory applications employing a 6T SRAM bit cell, for example.

Also, by reducing the pre-charge voltage asserted on the bit line coupled to the 5T SRAM bit cell circuit of the CIM circuit in a read operation, the voltage margin between the reduced bit line pre-charge voltage and the supply voltage powering the SRAM bit cell may be increased. Thus, by employing a reduced bit line pre-charge voltage for read operations to the CIM circuit, there is a voltage margin available to allow the supply voltage supplied to the 5T SRAM bit cell circuit of the CIM circuit to be reduced. Reducing the supply voltage to the CIM circuit can further reduce standby and dynamic power of the CIM circuit without increasing the likelihood of a read disturbance in its 5T SRAM bit cell circuit. The reduced supply voltage can allow a storage node in the 5T SRAM bit cell to still be discharged fast enough in a read operation to avoid a read disturbance condition, because the bit line pre-charge voltage to be discharged in the 5T SRAM bit cell is also reduced.

However, with a reduced supply voltage supplied to the 5T SRAM bit cell circuit with no complementary access transistor, writing data into the 5T SRAM bit cell circuit can be difficult. This is because of a write contention issue between a weaker NFET access transistor and a stronger pull-down NFET transistor in the 5T SRAM bit cell circuit. Thus, in further exemplary aspects, the supply voltage supplied to the 5T SRAM bit cell circuit can be boosted in a write operation to provide write assist to avoid or reduce the risk of write contention in the 5T SRAM bit cell circuit of the CIM circuit. Further, because a machine-learning application employing the CIM circuits may involve many more read operations than write operations, boosting the supply voltage for a write operation to the CIM circuit may not have a significant impact on overall dynamic power consumption of the CIM circuit. Also, if desired, the supply voltage supplied to the 5T SRAM bit cell circuit in the CIM circuit can also optionally be boosted in a read operation to provide read assist to the SRAM bit cell circuit. Providing read assist can make a read operation to the SRAM bit cell circuit faster thus expending less dynamic power in a read operation.

In another aspect, the CIM system can include one or more arrays of CIM circuits in one or more respective CIM array circuits each coupled to a common, global bit line. To reduce the line capacitance of the bit line coupled to the CIM circuits in a given CIM array circuit, the bit line driver circuit can be physically located between end CIM circuits in its respective CIM array circuit. For example, the bit line driver circuit can be physically located in the middle of the CIM array circuit to reduce the distance between the bit line driver circuit and the farthest away CIM circuit in the CIM array circuit. As an example, one bit line can be provided to half of the CIM circuits in a given CIM array circuit that is driven by the bit line driver circuit, and another bit line provided and driven by the bit line driver circuit to a second half of the CIM circuits. In this manner, the two (2) bit lines each have a length that is reduced by approximately half versus a single bit line coupled to all of the CIM circuits in the CIM array. This allows the length of the bit line driven by bit line driver circuit to be reduced and thus reduce the line capacitance of the bit line. Reducing the line capacitance in the bit line can reduce the time to pre-charge the bit line for a read operation and assert write data for a write operation, thus reducing dynamic power expended by the CIM circuit.

In another exemplary aspect, a capacitor circuit can be provided and coupled to a multiplication output node of the multiplication circuit in the CIM circuit. The capacitor circuit stores a charge representing the multiplication product output of the multiplication operation of the CIM circuit to be asserted and accumulated on a global bit line. The capacitor circuit can be provided as a non-volatile (NV) capacitor circuit that has the ability to retain a charge in a non-volatile manner over power cycles.

In another exemplary aspect, a global bit line driver used to pre-charge the global bit line can also be configured to pre-charge the global bit line at a reduced supply voltage (e.g., $V_{DD}/2$). The global bit line may be coupled to a plurality of multiplication outputs of CIM circuits in a CIM column array circuit for example, where the charges of the multiplication outputs are accumulated on the global bit line in a multiplication operation. Before the CIM circuits are activated to perform multiplication operations, the global bit line is pre-charged. Reducing the pre-charge voltage on the global bit line can reduce dynamic power of the CIM circuits in a given CIM circuit array for multiplication operations.

In this regard in one aspect, a CIM circuit is provided. The CIM circuit includes a bit line. The CIM circuit also includes an SRAM) bit cell. The SRAM bit cell circuit includes a storage circuit that includes a true inverter circuit comprising a true inverter input node and a true inverter output node comprising a true storage node, and a complement inverter circuit comprising a complement inverter input node coupled to the true inverter output node, and a complement inverter output node comprising a complement storage node coupled only to the true inverter input node. The SRAM bit cell circuit also includes an access circuit coupled to the true storage node. The CIM circuit also includes a multiplication circuit comprising a first multiplication input node coupled to the storage circuit, a second multiplication input node, and a multiplication output node. The multiplication circuit is configured to generate on the multiplication output node, a multiplication product of a first multiplication input on the first multiplication input node and a second multiplication input on the second multiplication input node.

In another exemplary aspect, a method of performing a CIM operation is provided. The method includes activating an access circuit to couple a bit line to a true storage node of a true inverter circuit of an SRAM bit cell circuit. The SRAM bit cell circuit comprises the true inverter circuit comprising a true inverter input node and an true inverter output node comprising the true storage node, and a complement inverter circuit comprising a complement inverter input node coupled to the true inverter output node, and a complement inverter output node comprising a complement storage node coupled only to the true inverter input node. The method also includes providing a true data value from the true storage node as a first multiplication input to a first multiplication input node of a multiplication circuit. The method also includes generating a multiplication product on a multiplication output node of the multiplication circuit based on a multiplication of the first multiplication input and the second multiplication input.

In another exemplary aspect, a memory system is provided. The memory system includes a CIM array circuit comprising a plurality of CM circuits. Each CIM circuit in a CIM array circuit includes an SRAM bit cell circuit that includes a storage circuit comprising a true inverter circuit comprising a true inverter input node and a true inverter output node comprising a true storage node, a complement inverter circuit comprising a complement inverter input node coupled to the true inverter output node, and a complement inverter output node comprising a complement storage node coupled only to the true inverter input node and an access circuit coupled to the true storage node. Each CIM circuit in a CIM array circuit also includes a multiplication circuit comprising a first multiplication input node coupled to the storage circuit, a second multiplication input node, and a multiplication output node. The multiplication circuit is configured to generate on the multiplication output node, a multiplication product of a multiplication of a first multiplication input on the first multiplication input node and a second multiplication input on the second multiplication input node. The CIM array circuit also includes a first bit line coupled to each of the access circuits of a first subset of the plurality of CIM circuits. The CIM array circuit also includes a second bit line coupled to each of the access circuits of a second subset of the plurality of CIM circuits different from the first subset of the plurality of CIM circuits. The CIM array circuit also includes a bit line driver circuit coupled to the first bit line and the second bit line. The bit line driver circuit is configured to pre-charge the first bit line to a first pre-charge voltage of true read data and pre-charge the second bit line to a second pre-charge voltage of complement read data.

BRIEF DESCRIPTION OF THE FIGURES

FIG. 2 is a diagram of an exclusive negative OR (NOR) (XNOR) truth table to show that an XNOR logic operation can be used for binary multiplication;

DETAILED DESCRIPTION

Figure 1:
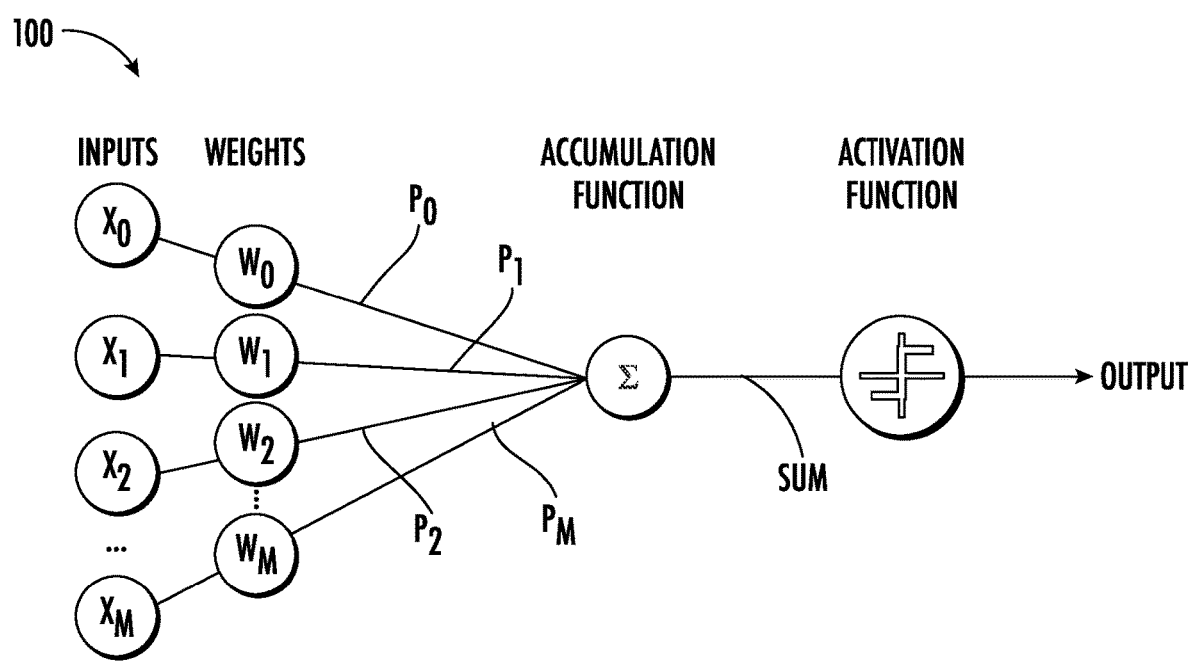
FIG. 1 is a diagram of exemplary multiply-and-accumulate (MAC) operations of a node of a deep neural network (DNN)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include low-power compute-in-memory (CIM) systems employing CIM circuits employing static random access memory (SRAM) bit cells. As a non-limiting example, the CIM circuits can be used for multiply-and-accumulate (MAC) operations, such as those employed in machine-learning applications. The CIM circuits each include a SRAM bit cell circuit that includes a storage circuit for storing data. Data can be read from the storage circuit of the SRAM bit cell circuit by pre-charging a bit line and activating an access circuit (e.g., an access transistor) coupled between the bit line and the storage circuit. Data can be written to the storage circuit of the SRAM bit cell circuit by asserting a voltage of the desired logic level on the bit line and activating the access circuit. In aspects disclosed herein, the CIM circuit can also perform a multiplication operation between input data and storage data in the storage circuit of the SRAM bit cell. In this regard, the CIM circuit includes a multiplication circuit coupled to the SRAM bit cell circuit. As examples, the multiplication circuit can be an exclusive OR (XOR)-based circuit configured to perform an XOR-based logic operation (e.g., an XOR or exclusive negative OR (XNOR) operation) to perform a multiplication operation. The CIM circuit is configured to perform multiplication of an input data on a received input signal in the multiplication circuit with a weight data from the storage data in the SRAM bit cell circuit. The CIM system can employ a large number of CIM circuits. Thus, it may be desired to reduce standby and/or dynamic power dissipation in the CIM circuits to reduce the overall power dissipation in the CIM system.

In this regard, in an exemplary aspect, the CIM system includes a bit line driver circuit configured to pre-charge a bit line coupled to a SRAM bit cell circuit of a CIM circuit for a read operation. Because the bit line driver circuit may be coupled to more than one CIM circuit, the access circuit of the SRAM bit cell circuit to be read is also activated so that the charge stored in the storage circuit can be passed through the access circuit to the bit line. To reduce dynamic power in read operations to the CIM circuit, the bit line driver circuit can be configured to pre-charge the bit line to a reduced pre-charge voltage. For example, the CIM system may be included in a processor-based system that includes other memory arrays that are powered by a memory domain supply voltage (e.g., $V_{DD}$) in a memory domain. The bit line driver circuit is configured to pre-charge the bit line to a reduced pre-charge voltage level (e.g. $V_{DD}/2$) from the voltage level of the memory domain supply voltage as an example. By reducing the pre-charge voltage on the bit line, dynamic power for a read operation to the CIM circuit is reduced. The voltage swings in pre-charging the bit line for read operations is also reduced, thereby further reducing dynamic power dissipated for read operations. However, reducing the bit line pre-charge voltage for a read operation can cause a read disturbance issue between the storage circuit and the access circuit of the SRAM bit cell. For example, in a complementary six-transistor (6T) SRAM bit cell circuit, a reduced bit line pre-charge voltage asserted on a bit line for a read operation may not cause a pull-down N-type field-effect transistor (FET) (NFET) in an inverter circuit reinforcing a stored logic '0' value to discharge fast enough to avoid a respective access circuit causing a charge build up on its storage node. This could cause a voltage flip on the complementary storage node.

Thus, in a further exemplary aspect, the SRAM bit cell circuit in the CIM circuit can be provided as a five-transistor (5T) SRAM bit cell circuit. The 5T SRAM bit cell includes a true inverter circuit cross-coupled to a complement inverter circuit. A single access circuit is coupled between a single bit line and the true inverter circuit. The 5T SRAM bit cell circuit eliminates a complement bit line and complement access circuit (e.g., a complement access transistor) coupled to the complement inverter circuit as compared to a 6T complement SRAM bit cell circuit. By eliminating the complement access circuit in the 5T SRAM bit cell circuit of the CIM circuit, a contention that could exist between a complement access circuit and a complement inverter circuit in the 5T SRAM bit cell circuit from charging the bit line to a reduced pre-charge voltage in a read operation is reduced or avoided. Also by eliminating a complement bit line and complement access transistor in the 5T SRAM bit cell circuit of the CIM circuit, dynamic and standby power of the CIM circuit can be further reduced.

A bit line and complement bit line are provided in a 6T SRAM bit cell to provide differential voltages between a bit line and complement bit line to accomplish a high read sensitivity for a read operation that may not be required in the CIM circuit. Highly accurate read sensing may not be as important in applications that employ the CIM circuit as memory applications employing a 6T SRAM bit cell, for example.

Also, by reducing the pre-charge voltage asserted on the bit line coupled to the 5T SRAM bit cell circuit of the CIM circuit in a read operation, the voltage margin between the reduced bit line pre-charge voltage and the supply voltage powering the SRAM bit cell may be increased. Thus, by employing a reduced bit line pre-charge voltage for read operations to the CIM circuit, there is a voltage margin available to allow the supply voltage supplied to the 5T SRAM bit cell circuit of the CIM circuit to be reduced. Reducing the supply voltage to the CIM circuit can further reduce standby and dynamic power of the CIM circuit without increasing the likelihood of a read disturbance in its 5T SRAM bit cell circuit. The reduced supply voltage can allow a storage node in the 5T SRAM bit cell to still be discharged fast enough in a read operation to avoid a read disturbance condition, because the bit line pre-charge voltage to be discharged in the 5T SRAM bit cell is also reduced.

However, with a reduced supply voltage supplied to the 5T SRAM bit cell circuit with no complementary access transistor, writing data into the 5T SRAM bit cell circuit can be difficult. This is because of a write contention issue between a weaker NFET access transistor and a stronger pull-down NFET transistor in the 5T SRAM bit cell circuit. Thus, in further exemplary aspects, the supply voltage supplied to the 5T SRAM bit cell circuit can be boosted in a write operation to provide write assist to avoid or reduce the risk of write contention in the 5T SRAM bit cell circuit of the CIM circuit. Further, because a machine-learning application employing the CIM circuits may involve many more read operations than write operations, boosting the supply voltage for a write operation to the CIM circuit may not have a significant impact on overall dynamic power consumption of the CIM circuit. Also, if desired, the supply voltage supplied to the 5T SRAM bit cell circuit in the CIM circuit can also optionally be boosted in a read operation to provide read assist to the SRAM bit cell circuit. Providing read assist can make a read operation to the SRAM bit cell circuit faster thus expending less dynamic power in a read operation.

In another aspect, the CIM system can include one or more arrays of CIM circuits in one or more respective CIM array circuits each coupled to a common, global bit line. To reduce the line capacitance of the bit line coupled to the CIM circuits in a given CIM array circuit, the bit line driver circuit can be physically located between end CIM circuits in its respective CIM array circuit. For example, the bit line driver circuit can be physically located in the middle of the CIM array circuit to reduce the distance between the bit line driver circuit and the farthest away CIM circuit in the CIM array circuit. As an example, one bit line can be provided to half of the CIM circuits in a given CIM array circuit that is driven by the bit line driver circuit, and another bit line provided and driven by the bit line driver circuit to a second half of the CIM circuits. In this manner, the two (2) bit lines each have a length that is reduced by approximately half versus a single bit line coupled to all of the CIM circuits in the CIM array. This allows the length of the bit line driven by bit line driver circuit to be reduced and thus reduce the line capacitance of the bit line. Reducing the line capacitance in the bit line can reduce the time to pre-charge the bit line for a read operation and assert write data for a write operation, thus reducing dynamic power expended by the CIM circuit.

In another exemplary aspect, a capacitor circuit can be provided and coupled to a multiplication output node of the multiplication circuit in the CIM circuit. The capacitor circuit stores a charge representing the multiplication product output of the multiplication operation of the CIM circuit to be asserted and accumulated on a global bit line. The capacitor circuit can be provided as a non-volatile (NV) capacitor circuit that has the ability to retain a charge in a non-volatile manner over power cycles.

In another exemplary aspect, a global bit line driver used to pre-charge the global bit line can also be configured to pre-charge the global bit line at a reduced supply voltage (e.g., $V_{DD}/2$). The global bit line may be coupled to a plurality of multiplication outputs of CIM circuits in a CIM column array circuit for example, where the charges of the multiplication outputs are accumulated on the global bit line in a multiplication operation. Before the CIM circuits are activated to perform multiplication operations, the global bit line is pre-charged. Reducing the pre-charge voltage on the global bit line can reduce dynamic power of the CIM circuits in a given CIM circuit array for multiplication operations.

As discussed above, the CIM circuits include an XOR-based circuit that can provide a binary multiplication operation. FIG. 2 is a diagram of an XNOR logic truth table 200 to show that an XNOR operation on two inputs X and Y to generate an XNOR output 202 is equivalent to a binary multiplication operation of inputs X and Y. Binary multiplication of inputs X and Y as either both '0' or '1' values is equal to '1', which is the XNOR output 202 of an XNOR operation as shown in FIG. 2. Binary multiplication of inputs X and Y as one having a value '0' and the other having a value of '1' is equal to '0', which is also the XNOR output 202 of an XNOR operation as shown in FIG. 2. Thus, an XOR-based circuit to perform an XOR-based logic operation, such as an XNOR logic operation, can be used for binary multiplication. An XOR-based circuit can be incorporated with a memory bit cell to perform binary multiplication of a stored value in the memory bit cell with a second input value. This circuit arrangement may be particularly useful for machine-learning applications where weight values as an input value to the XOR-based circuit are stored values in the memory bit cell.

Before discussing examples of CIM circuits that include memory bit cells each with an integrated multiplication circuit configured to perform a low-power multiplication operation starting at FIG. 4, an exemplary CIM circuit that includes a memory bit cell in the form of a 6T SRAM bit cell circuit is first described with regard to FIG. 3 below.

Figure 3:
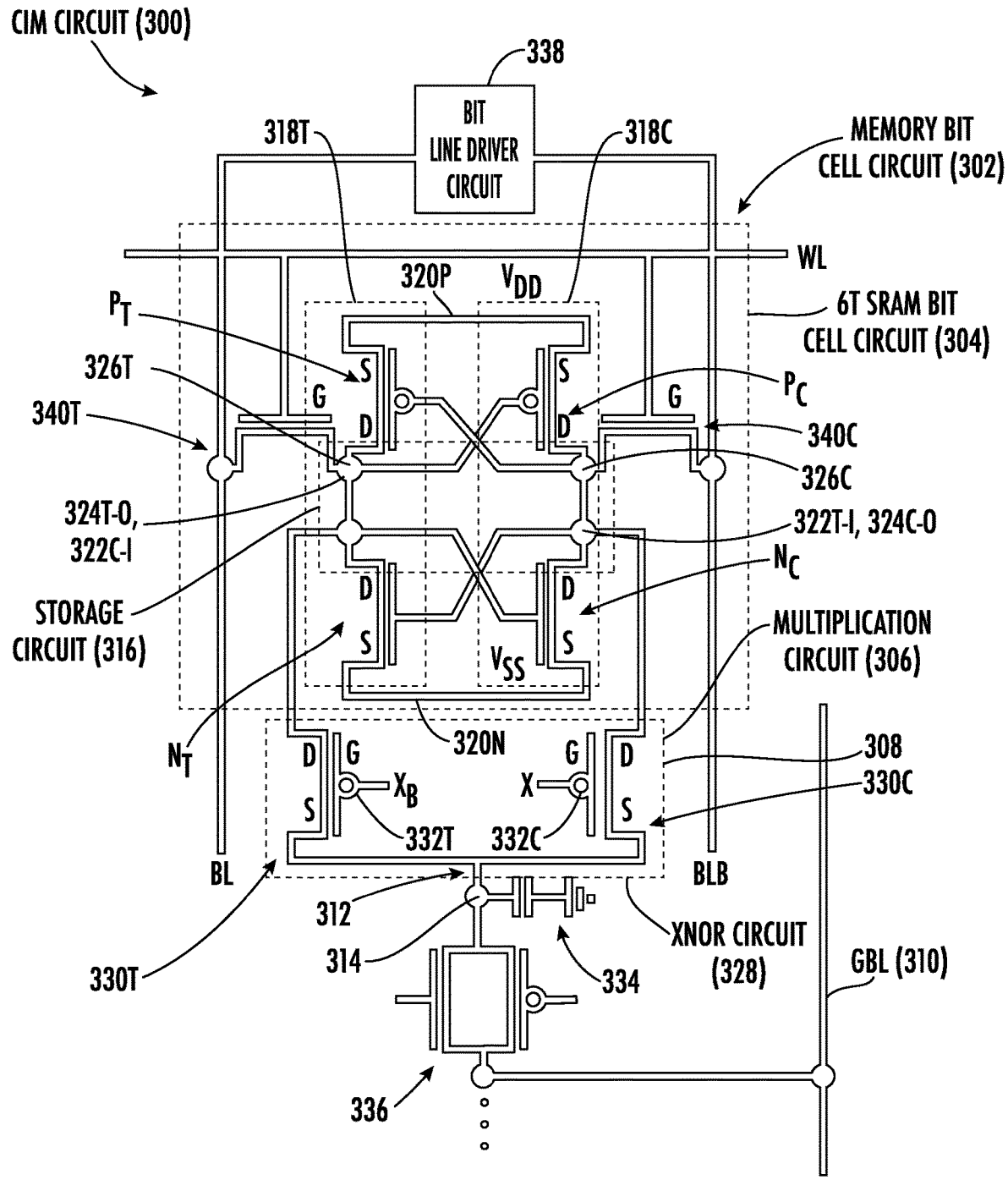
FIG. 3 is a diagram of an exemplary compute-in-memory (CIM) circuit that includes a six-transistor (6T) static random access memory (SRAM) bit cell and a multiplication circuit in the form of an exclusive OR (XOR)-based circuit, wherein the CIM circuit is configured to perform a multiplication operation of a data value stored in the SRAM bit cell circuit with an input value provided to the multiplication circuit.

In this regard, FIG. 3 is a diagram of an exemplary CIM circuit 300 that includes a memory bit cell circuit 302 in the form of a 6T SRAM bit cell circuit 304 coupled to a multiplication circuit 306. In this example, the multiplication circuit 306 is in the form of an XOR-based circuit 308 that is configured to perform an XOR-based logic operation (e.g., an XNOR logic operation). The CIM circuit 300 is configured to perform a binary multiplication of a stored data value as storage data in the 6T SRAM bit cell circuit 304 with an input data value X provided to the multiplication circuit 306. The input data value X is signified by the label 'X' in FIG. 3. The complement data value of the input data value X is signified by the label '$X_B$' in FIG. 3. A plurality of the CIM circuits 300 can be arranged in a memory array in row and column format to provide MAC operation. For example, CIM circuits 300 can be arranged in a column array, where each of the outputs of the CIM circuits 300 are coupled to a common, global bit line (GBL) 310 to provide a binary multiplication output 312 from the multiplication circuit 306 on a multiplication output node 314 in the form of a charge on the GBL 310 as a multiplication product. In this manner, the charges of the binary multiplication outputs 312 asserted from each of the CIM circuits 300 on the GBL 310 can be accumulated as an accumulated charge representing a dot product to provide an accumulate operation as part of a MAC operation.

With continuing reference to FIG. 3, the 6T SRAM bit cell circuit 304 includes a storage circuit 316 that includes a true inverter circuit 318T and a complement inverter circuit 318C. The true inverter circuit 318T and complement inverter circuit 318C each include respective pull-up true and complement positive (P)-type field-effect transistors (FETs) (PFETs) $P_T$, $P_C$ and pull-down true and complement negative (N)-type FETs (NFETs) $N_T$, $N_C$ for a total of four (4) transistors. The true and complement PFETs $P_T$, $P_C$ are coupled to a positive supply voltage rail 320P configured to receive a supply voltage $V_{DD}$. The true and complement NFETs $N_T$, $N_C$ are coupled to a negative supply voltage rail 320N, which is a ground node in this example and is configured to receive a ground voltage $V_{SS}$. The true inverter circuit 318T has a true inverter input node 322T-I that is configured to receive an input signal to generate an output signal on a true inverter output node 324T-O of an opposite logic value of the logic value of the input signal. For example, if an input signal on the true inverter input node 322T-I is a voltage of the positive supply voltage $V_{DD}$, the true inverter circuit 318T is configured to generate an output signal on the true inverter output node 324T-O based on the ground voltage $V_{SS}$. If an input signal on the true inverter input node 322T-I is a voltage of the ground voltage $V_{SS}$, the true inverter circuit 318T is configured to generate an output signal on the true inverter output node 324T-O based on the positive supply voltage $V_{DD}$. The complement inverter circuit 318C is configured to generate an output signal on its complement inverter output node 324C-O that has a logic value opposite of the output signal generated by the true inverter circuit 318T on the true inverter output node 324T-O.

The true inverter circuit 318T and a complement inverter circuit 318C are cross-coupled to each other by the true inverter input node 322T-I being coupled to the complement inverter output node 324C-O, and the complement inverter input node 322C-I being coupled to the true inverter output node 324T-O. The complement inverter input node 322C-1 being coupled to the true inverter output node 324T-O forms a true storage node 326T. The true inverter input node 322T-I being coupled to the complement inverter output node 324C-0 forms a complement storage node 326C. The SRAM bit cell circuit 304 enforces the voltage at the true storage node 326T representing a complement logic value to a voltage at the complement storage node 326C. The cross-coupling of the true and complement inverter circuits 318T, 318C keeps the voltage on the true and complement storage nodes 326T, 326T reinforced for retention until a write operation occurs that changes the stored voltages on the true and complement storage nodes 326T, 326C.

To perform a multiplication operation of storage data in the storage circuit 316 in the 6T SRAM bit cell circuit 304 of the CIM circuit 300, the multiplication circuit 306 in the form of an XNOR circuit 328 in this example is configured to perform an XNOR logic operation like shown in FIG. 2. The XNOR circuit 328 includes a true and complement PFET 330T, 330C that include respective gates G coupled to respective true and complement multiplication input nodes 332T, 332C. The gates G of the true and complement PFETs 330T, 330C are configured to receive respective input data signals represented as input data X and $X_B$. The input data $X_B$, X stored at only one of the respective true and complement storage nodes 326T, 326C is passed by the respective PFETs 330T, 330C of the XNOR circuit 328 to the multiplication output node 314 at a time, because only one of the PFETs 330T, 330C will be active at a time based on complement voltages between the input data X and $X_B$. The XNOR circuit 328 is configured perform an XNOR operation between respective true data $X_B$, X and respective storage data on the true and complement storage nodes 326T, 326C as additional respective multiplication input nodes to generate the multiplication output 312 on the multiplication output node 314. For example, the data stored on the true storage node 326T may be weight data that is multiplied by the input data $X_B$ by the multiplication circuit 306 for a machine-learning application. The multiplication operation in the CIM circuit 300 is similar to a read operation in a 6T SRAM memory bit cell in that the storage data stored at the true and complement storage nodes 326T, 326C is also discharged to the bit line BL and complement bit line BLB.

The CIM circuit 300 also includes a capacitor circuit 334 that is configured to store a charge to latch the multiplication output 312. The CIM circuit 300 also includes a pass gate 336 that acts as a selection device to control current flow in the CIM circuit 300 to perform a multiplication operation and control the passing of the latched charge in the capacitor circuit 334 to the GBL 310. In this manner, a charge representing the multiplication output 312 that is passed to the GBL 310 can be accumulated with other charges representing multiplication outputs from other CIM circuits as dot products to provide a MAC operation.

To read data from the storage circuit 316 of the 6T SRAM bit cell circuit 304, a bit line driver circuit 338 is also provided. The bit line driver circuit 338 is configured to pre-charge the bit line BL and complement bit line BLB to complement voltages levels based on the supply voltage $V_{DD}$ powering the SRAM bit cell circuit 304 to read data stored in the storage circuit 316 in a read operation. A word line (WL) coupled to the gates G of true and complement access circuits 340T, 340C (which are NFETs in this example providing a total of six (6) transistors in the SRAM bit cell circuit 304) is asserted to evaluate the differential voltages on the true storage node 326T and complement storage node 326C. For example, if a voltage representing a logic value of '1' is stored at the true storage node 326T, and a voltage representing a logic value level of '0' is stored at the complement storage node 326C, the PFET $P_T$ maintains the charge on the true storage node 326T. The true access circuit 340T passes the charge on the true storage node 326T to the bit line BL to represent a stored logic '1' value in the storage node 326T. The voltage representing a logic value of '1' stored at the true storage node 326T causes the complement NFET $N_C$ to discharge the pre-charge voltage on the complement bit line BLB to represent a logic '0' value in the complement storage node 326C.

To write data to the storage circuit 316 of the 6T SRAM bit cell circuit 304, the bit line driver circuit 338 is also configured to assert write data and complement write data as a write voltage and complement write voltage on the respective bit line BL and complement bit line BLB based on the supply voltage $V_{DD}$ powering the 6T SRAM bit cell circuit 304. This causes the write voltages on the bit line BL and complement bit line BLB to be passed to the respective true and complement storage nodes 326T, 326C through the activated true and complement access circuits 340T, 340C as written data.

The active or dynamic power dissipated by the CIM circuit 300 in its operation is a function of the voltage level of the supply voltage $V_{DD}$ on the positive supply voltage rail 320P, the voltage swings in pre-charging and discharging of the bit line BL and complement bit line BLB, and the capacitance of the bit line BL and complement bit line BLB. The voltage levels of the supply voltages $V_{DD}$, $V_{SS}$ at the positive and negative supply voltage rails 320P, 320N affect the active power dissipated by the true and complement inverter circuits 318T, 318C in the 6T SRAM bit cell circuit 304 and the multiplication circuit 306 in a multiplication operation. The voltage levels of the supply voltages $V_{DD}$, $V_{SS}$ at the positive and negative supply voltage rails 320P, 320N also determine the swing voltage level when pre-charging the bit line BL and complement bit line BLB for a write operation to the 6T SRAM bit cell circuit 304. The line capacitance of the bit line BL and complement bit line BLB, which increases as a function of their length, also affects dynamic power dissipation by the CIM circuit 300 for multiplication and write operations. An increased line capacitance of the bit line BL and complement bit line BLB results in an increase in charge time and thus results in an increase in dynamic power to pre-charge and discharge the bit line BL and complement bit line BLB. Dynamic power of the CIM circuit 300 is also consumed by the multiplication operation causing the stored voltage in the true and complement storage nodes 326T, 326C to be discharged to the bit line BL and complement bit line BLB similar to a read operation in a conventional 6T SRAM memory bit cell.

The voltage levels of the supply voltages $V_{DD}$, $V_{SS}$ at the positive and negative supply voltage rails 320P, 320N also affect standby (i.e., idle) power dissipated by the CIM circuit 300. The supply voltage $V_{DD}$ at the positive supply voltage rail 320P provides power to the true and complement inverter circuits 318T, 318C of the 6T SRAM bit cell circuit 304 during standby operation to reinforce the voltage as storage data at the true and complement storage nodes 326T, 326C in the storage circuit 316 as stored data. The voltage levels of the supply voltages $V_{DD}$, $V_{SS}$ at the positive and negative supply voltage rails 320P, 320N also affect the amount of leakage current in the true and complement access circuits 340T, 340C, thus affecting power dissipation of the 6T SRAM bit cell circuit 304.

It is desired to reduce the power consumption of the CIM circuit 300, particularly if employed in lower-power applications, such as mobile devices. For example, a memory array may contain a large number of CIM circuits 300. Thus, the active and standby power dissipated by a CIM circuit 300 is multiplied by the number of CIM circuits 300 present in a memory array.

Figure 4:
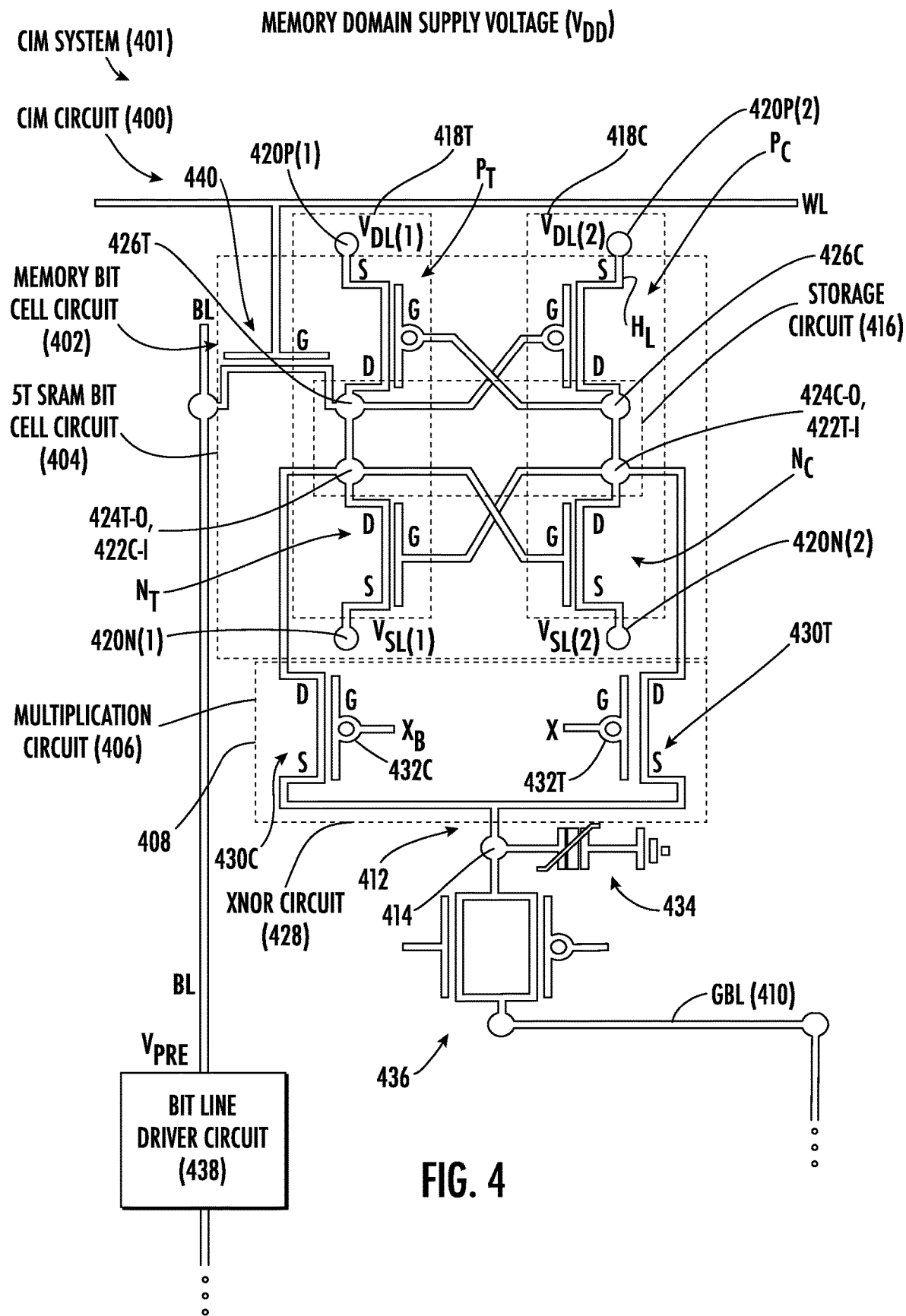
FIG. 4 is a diagram of an exemplary CIM circuit that includes a five-transistor (5T) SRAM bit cell circuit configured to be coupled to a single bit line and a multiplication circuit in the form of an XOR-based circuit for generating a multiplication output representing a multiplication operation of an input data value with a storage data value in the 5T SRAM bit cell circuit with an input data value, wherein the CIM circuit is configured to be operated at a reduced supply voltage to reduce standby and dynamic power.

In this regard, FIG. 4 is a diagram of an exemplary CIM circuit 400 that is included in a CIM system 401. The CIM system 401 can include a plurality of other CIM circuits 400 (not shown). The CIM circuit 400 includes a memory bit cell circuit 402 that includes a 5T SRAM bit cell circuit 404, as opposed to the 6T SRAM bit cell circuit 304 in the CIM circuit 300 in FIG. 3. The 5T SRAM bit cell circuit 404 is coupled to a multiplication circuit 406, which is an XOR-based circuit 408 in this example, to perform a multiplication operation of storage data in the 5T SRAM bit cell circuit 404 with input data provided to the multiplication circuit 406. The 5T SRAM bit cell circuit 404 eliminates the complement access circuit like provided as the complement access circuit 340C present in the 6T SRAM bit cell circuit 304 in FIG. 3. The 5T SRAM bit cell circuit 404 also eliminates a complement bit line circuit like present as the complement bit line BLB in the 6T SRAM bit cell circuit 304 in FIG. 3. As discussed in more detail below, providing the 5T SRAM bit cell circuit 404 in this manner in the CIM circuit 400 facilitates operation the CIM circuit 400 to perform multiplication (i.e., read) and write operations while consuming less dynamic and standby power over the CIM circuit 300 in FIG. 3.

In this regard, as illustrated in FIG. 4, the 5T SRAM bit cell circuit 404 includes a storage circuit 416 that includes a true inverter circuit 418T and a complement inverter circuit 418C. The true inverter circuit 418T and complement inverter circuit 418C each include respective pull-up true and complement PFETs $P_T$, $P_C$ and pull-down true and complement negative NFETs $N_T$, $N_C$ for a total of four (4) transistors. The true PFET $P_T$ is coupled to a first positive supply voltage rail 420P(1) configured to receive a first supply voltage $V_{DL(1)}$. The complement PFET $P_C$ is coupled to a second positive supply voltage rail 420P(2) configured to receive a second supply voltage $V_{DL(2)}$. The second supply voltage $V_{DL(2)}$ may be equal to or based on the first supply voltage $V_{DL(1)}$ in idle/standby operation to retain the storage data in the true and complement storage nodes 426T, 426C. The true NFET $N_T$ is coupled to a first negative supply voltage rail 420N(1) configured to receive a first ground voltage $V_{SL(1)}$, which is a ground voltage in this example. The complement NFET $N_C$ is coupled to a second negative supply voltage rail 420N(2) configured to receive a second ground voltage $V_{SL(2)}$, which is a ground voltage in this example. The second ground voltage $V_{SL(2)}$ may be equal to or based on the first ground voltage $V_{SL(1)}$ in idle/standby operation to retain the storage data in the true and complement storage nodes 426T, 426C.

The true inverter circuit 418T has a true inverter input node 422T-I that is configured to receive an input signal to generate an output signal on a true inverter output node 424T-O of an opposite logic value of the logic value of the input signal. For example, if an input signal on the true inverter input node 422T-I is a voltage based on the first positive supply voltage $V_{DL(1)}$, the true inverter circuit 418T is configured to generate an output signal on the true inverter output node 424T-O based on ground voltage $V_{SL(1)}$. If an input signal on the true inverter input node 422T-I is a voltage based on the first ground voltage $V_{SL(1)}$, the true inverter circuit 418T is configured to generate an output signal on the true inverter output node 424T-O based on the first positive supply voltage $V_{DL(1)}$.

The complement inverter circuit 418C has a complement inverter input node 422C-I that is configured to receive an input signal generate an output signal on a complement inverter output node 424C-O of an opposite logic value of the logic value of the input signal. For example, if an input signal on the complement inverter input node 422C-I is a voltage based on the second positive supply voltage $V_{DL(2)}$, the complement inverter circuit 418C is configured to generate an output signal on the complement inverter output node 424C-O based on second ground voltage $V_{SL(2)}$. If an input signal on the complement inverter input node 422C-I is a voltage based on the second ground voltage $V_{SL(2)}$, the complement inverter circuit 418C is configured to generate an output signal on the true inverter output node 424T-O based on the second positive supply voltage $V_{DL(2)}$.

The true inverter circuit 418T and a complement inverter circuit 418C are cross-coupled to each other by the true inverter input node 422T-I being coupled to the complement inverter output node 424C-0, and the complement inverter input node 422C-I being coupled to the true inverter output node 424T-O. The complement inverter input node 422C-I being coupled to the true inverter output node 424T-O forms a true storage node 426T. The true inverter input node 422T-I being coupled to the complement inverter output node 424C-0 forms a complement storage node 426C. The voltage level of the voltage at the true storage node 426T is the complement of the voltage at the complement storage node 426C. The cross-coupling of the true and complement inverter circuits 418T, 418C keeps the voltage on the true and complement storage nodes 426T, 426C reinforced for retention until a write operation occurs changing the stored voltages.

To perform a multiplication operation of storage data in the storage circuit 416 in the 5T SRAM bit cell circuit 404 of the CIM circuit 400 in FIG. 4, the multiplication circuit 406 in the form of an XNOR circuit 428 in this example is configured to perform an XNOR logic operation like shown in FIG. 2. The XNOR circuit 428 includes true and complement PFETs 430T, 430C that include respective gates G coupled to respective true and complement multiplication input nodes 432T, 432C. Drains D of the true and complement PFETs 430T, 430C are coupled to the respective complement and true storage nodes 426C, 426T. Sources S of the true and complement PFETs 430T, 430C are coupled to a multiplication output node 414 of the XNOR circuit 428. The gates G of the true and complement PFETs 430T, 430C are configured to receive respective input signals represented as input data X and $X_B$. The input data X and $X_B$ stored at only one of the complement and true storage nodes 426C, 426T is passed by the respective true and complement PFETs 430T, 430C of the XNOR circuit 428 to the multiplication output node 414 at a time, because only one of the PFETs 430T, 430C will be active at a time based on complement voltages between the input data X and $X_B$. The XNOR circuit 428 is configured perform an XNOR logic operation between a respective true input signal X and $X_B$ and the respective storage data on the complement and true storage nodes 426C, 426T as additional respective multiplication input nodes to generate a multiplication output 412 on the multiplication output node 414. For example, the data stored on the true storage node 426T may be weight data multiplied by the input data X for a machine-learning application. The multiplication operation performed by the CIM circuit 400 is similar to a read operation for a SRAM bit cell circuit in that the storage data on the true and complement storage nodes 426T, 426C is also discharged to the bit line BL.

The CIM circuit 400 in FIG. 4 also includes a capacitor circuit 434 that is configured to store a charge to latch the multiplication output 412. The capacitor circuit 434 could be a capacitor circuit that will eventually lose its charge in the absence of the CIM circuit 400 being powered. Alternatively, the capacitor circuit 434 could be a non-volatile (NV) capacitor circuit that is configured to retain charge even in the absence of power. In this manner, if the capacitor circuit 434 is provided as a NV capacitor circuit, the capacitor circuit 434 will retain the charge representing the multiplication output 412 of the CIM circuit 400 even through a power cycle of the CIM circuit 400. For example, the capacitor circuit 434 could be a ferroelectric capacitor that can store a charge by the polarization of a thin ferroelectric film by an external electric field and that remains polarized even with the external electric field removed. The CIM circuit 400 also includes a transmission gate 436 that acts as a selection device to control current flow in the CIM circuit 400 to perform a multiplication operation and control passing of the latched charge in the capacitor circuit 434 to a GBL 410. In this manner, a charge representing the multiplication output 412 that is passed to the GBL 410 can be accumulated with other charges representing multiplication outputs from other CIM circuits to provide a MAC operation.

To read data from the storage circuit 416 of the 5T SRAM bit cell circuit 404, a bit line driver circuit 438 is also provided in the CIM system 401. The bit line driver circuit 438 is configured to pre-charge the bit line BL to a pre-charge voltage for a read operation. To perform a read operation, a pre-charge voltage is applied by the bit line driver circuit 438 to the bit line BL. A word line (WL) coupled to the gate G of an access circuit 440 (which is provided as an NFET in this example providing a total of five (5) transistors in the SRAM bit cell circuit 404) is also asserted to activate the access circuit 440 to electrically couple the bit line BL to the true storage node 426T. For example, in a read operation, if a voltage representing a logic value of '1' is stored at the true storage node 426T, and a voltage representing a logic value of '0' is stored at the complement storage node 426C, the true PFET $P_T$ in the true inverter circuit 418T maintains charge from the supply voltage $V_{DD}$ on the true storage node 426T that is passed to the bit line BL. If however, a voltage representing a logic value of '0' is stored at the true storage node 426T, a voltage representing a logic value of '1' is stored at the complement storage node 426C and causes the true PFET $P_T$ to be turned off. The true NFET $N_T$ is turned on to pull the true storage node 426T and the bit line BL to the first negative supply voltage rail 420N(1). The access circuit 440 passes the charge of the true storage node 426T to the bit line BL for the read operation. The voltage level on the bit line BL can be sensed to determine the logic of the data value stored in the true storage node 426T of the 5T SRAM bit cell circuit 404.

To reduce dynamic power of the CIM circuit 400, the bit line driver circuit 438 in this example is configured to pre-charge the bit line BL in the 5T SRAM bit cell circuit 404 to a reduced pre-charge voltage $V_{PRE}$. For example, the CIM system 401 may be included in a processor-based system that includes other memory arrays that are powered by a memory domain supply voltage (e.g. $V_{DD}$) in a memory domain. The bit line driver circuit 438 can be configured to pre-charge the bit line BL to a reduced pre-charge voltage $V_{PRE}$ of a lower voltage level than the memory domain supply voltage $V_{DD}$ for a write operation to the CIM circuit 400. The pre-charge voltage $V_{PRE}$ may be half the memory domain supply voltage $V_{DD}$ (e.g., $V_{DD}/2$) as an example. By reducing the pre-charge voltage $V_{PRE}$ on the bit line BL, dynamic power is reduced in the CIM circuit 400 for write operations. Also, the pre-charge time to pre-charge the bit line BL to the pre-charge voltage $V_{PRE}$ in the CIM circuit 400 is reduced as compared to pre-charging the bit line BL based on the voltage of the memory domain supply voltage $V_{DD}$. This increases the speed of the pre-charge time to provide for faster write operations and thus reduced dynamic power in write operations. The voltage swings in pre-charging the bit line BL for read operations is also reduced, thereby further reducing dynamic power dissipated in the CIM circuit 400 for read operations.

Providing the SRAM bit cell circuit in the CIM circuit 400 as the 5T SRAM bit cell circuit 404 can allow the pre-charge voltage $V_{PRE}$ asserted on the bit line BL to be reduced for a read operation without causing a read disturbance issue between the storage circuit 416 and the access circuit 440 of the 5T SRAM bit cell circuit 404. This is because a complement access circuit is not present in the 5T SRAM bit cell circuit 404, like present as the complement access circuit 340C in the 6T SRAM bit cell circuit 304 in FIG. 3 for example. If a complement access circuit coupled to the complement storage node 426C were included in the 5T SRAM bit cell circuit 404, a reduced pre-charge voltage $V_{PRE}$ asserted by the bit line driver circuit 438 on the bit line BL for a read operation could weaken the pull-down complement NFET $N_C$ in the complement inverter circuit 418C. In this case, the pull-down complement NFET $N_C$ may not discharge the pre-charge voltage passed by a complement access circuit from a complement bit line fast enough to prevent a charge build up from occurring on the complement storage node 426C from the reduced pre-charge voltage. This could then cause the true PFET $P_T$ to be turned off and cause a voltage flip on the true storage node 426T in a read operation. This could thus cause a voltage flip on the complement storage node 426C in the read operation.

Thus, by providing the SRAM bit cell circuit in the CIM circuit 400 as the 5T SRAM bit cell circuit 404, the pre-charge voltage $V_{PRE}$ asserted on the bit line BL for a read operation can be reduced or avoided, and without increasing the likelihood of a read disturbance issue. Also, eliminating the complement bit line and complement access circuit in the 5T SRAM bit cell circuit 404 can also reduce standby and dynamic power of the CIM circuit 400. The bit line BL and complement bit line BLB are provided in the 6T SRAM bit cell 304 in FIG. 3 to provide differential voltages between the bit line BL and complement bit line BLB to accomplish a high read sensitivity for a read operation that may not be required in the CIM circuit 400 in FIG. 4. Highly-accurate read sensing may not be as important in applications that employ the CIM circuit 400 as memory applications employing the 6T SRAM bit cell circuit 304 in FIG. 3 for example.

Also, reducing the pre-charge voltage $V_{PRE}$ asserted by the bit line driver circuit 438 on the bit line BL coupled to the 5T SRAM bit cell circuit 404 of the CIM circuit 404 in a read operation increases the voltage margin between the true storage node 426T and the supply voltage $V_{DL(1)}$ powering the SRAM bit cell circuit 404. The pre-charge voltage $V_{PRE}$ can be less than the positive supply voltage $V_{DL(1)}$. Thus, by employing a reduced bit line pre-charge voltage $V_{PRE}$ for read operations to the CIM circuit 400, there is a voltage margin available. This voltage margin allows the positive supply voltages $V_{DL(1)}$, $V_{DL(2)}$ supplied to the first and second positive supply voltage rails 420P(1), 420P(2) of the 5T SRAM bit cell circuit 404 of the CIM circuit 400 to be reduced without increasing the likelihood of a read disturbance in its 5T SRAM bit cell circuit 404. For example, the supply voltage $V_{DL(1)}$, $V_{DL(2)}$ may be half $V_{DD}/2$ of the memory domain supply voltage $V_{DD}$. Reducing the supply voltage of the 5T SRAM bit cell circuit 404 also reduces the standby (leakage) and dynamic power of the 5T SRAM bit cell circuit 404, and thus the CIM circuit 400. The reduced positive supply voltages $V_{DL(1)}$, $V_{DL(2)}$ can still allow the true storage node 426T in the 5T SRAM bit cell 404 storing a logic value '0' to be discharged fast enough to the first negative supply voltage rail 420N(1) in a read operation without a charge build up on the true storage node 426T to avoid or reduce a read disturbance condition.

However, with reduced positive supply voltages $V_{DL(1)}$, $V_{DL(2)}$ supplied to the 5T SRAM bit cell circuit 404 of the CIM circuit 400, where the 5T SRAM bit cell circuit 404 has no complement access transistor, writing data into the 5T SRAM bit-cell circuit 404 may be is difficult. A write contention issue may be present in the storage circuit 416 of the 5T SRAM bit cell circuit 404 for a write operation because of contention between a weaker NFET of the access circuit 440 and a stronger pull-down NFET $N_T$ of the inverter circuit 418T in this example. Thus, in further exemplary aspects, the second supply voltages $V_{DL(2)}$, $V_{SL(2)}$ supplied to the complement inverter circuit 418C of the 5T SRAM bit cell circuit 404 can be boosted in a write operation to provide write assist to avoid or reduce the risk of write contention in the 5T SRAM bit cell circuit 404 of the CIM circuit 400. Boosting the second supply voltages $V_{DL(2)}$, $V_{SL(2)}$ supplied to the complement inverter circuit 418C of the 5T SRAM bit cell circuit 404 can provide a write assist by assisting in flipping the state of the complement inverter 418C in the 5T SRAM bit cell circuit 404 in a write operation. The word line WL coupled to the 5T SRAM bit cell circuit 404 can also be boosted in a write operation.

If the CIM circuit 400 is employed in a machine-learning application, the 5T SRAM bit cell circuit 404 of the CIM circuit 404 may perform more read operations than write operations. Thus, boosting the second supply voltages $V_{DL(2)}$, $V_{SL(2)}$ of the complement inverter circuit 418C in a write operation to the CIM circuit 400 may not have a significant impact on overall dynamic power consumption of the CIM circuit 400. Boosting the second supply voltage $V_{DL(2)}$ can involve increasing the voltage of second supply voltage $V_{DL(2)}$ at the second positive supply voltage rail 420P(2). Boosting the second supply voltage $V_{SL(2)}$ can involve decreasing or lowering the voltage at the second negative supply voltage rail 420N(2). Also, if desired, the supply voltage supplied to the 5T SRAM bit cell circuit 404 in the CIM circuit 400 can also optionally be boosted in a read operation to provide read assist to the 5T SRAM bit cell circuit 404. Providing read assist can make a read operation to the 5T SRAM bit cell circuit 404 faster thus expending less dynamic power in a read operation.

Data can also be written to the storage circuit 416 of the 5T SRAM bit cell circuit 404 of the CIM circuit 400 that is used for the multiplication operation. In a write operation, the bit line driver circuit 338 asserts a write voltage on the bit line BL to represent the logic value of data to be written to the true storage node 426T. A word line (WL) coupled to the gate G of the single access circuit 440 is asserted to activate the access circuit 440 to pass the write data from the bit line BL to the true storage node 426T. The write voltage on the true storage node 426T causes the complement inverter circuit 418C to store a complement voltage to the write voltage on the complement storage node 426C. However, with lower positive supply voltages $V_{DL(1)}$, $V_{DL(2)}$ supplied to the 5T SRAM bit cell circuit 404 of the CIM circuit 400 in FIG. 4, a write contention issue may occur in the complement inverter circuit 418C in the storage circuit 416 for a write operation. For example, in a write operation, if a logic '1' is stored in the true storage node 426T and write data asserted on the bit line BL to be written to the true storage node 426T is a logic '0', the access circuit 440 discharges the true storage node 426T to the bit line BL to write a logic '0' to the true storage node 426T. The access circuit 440 is capable of passing a strong logic '0' as an NFET in this example. However, the logic '0' stored in the complement storage node 426C at the start of the write operation can cause the strengthened true PFET $P_r$ to overcome the drive strength of the access circuit 440 to charge the true storage node 426T to the supply voltage $V_{DL(1)}$ (i.e., a logic '1'), thus causing a write contention on the true storage node 426T. This in turn can cause a write contention issue on the complement storage node 426C.

Figure 5:
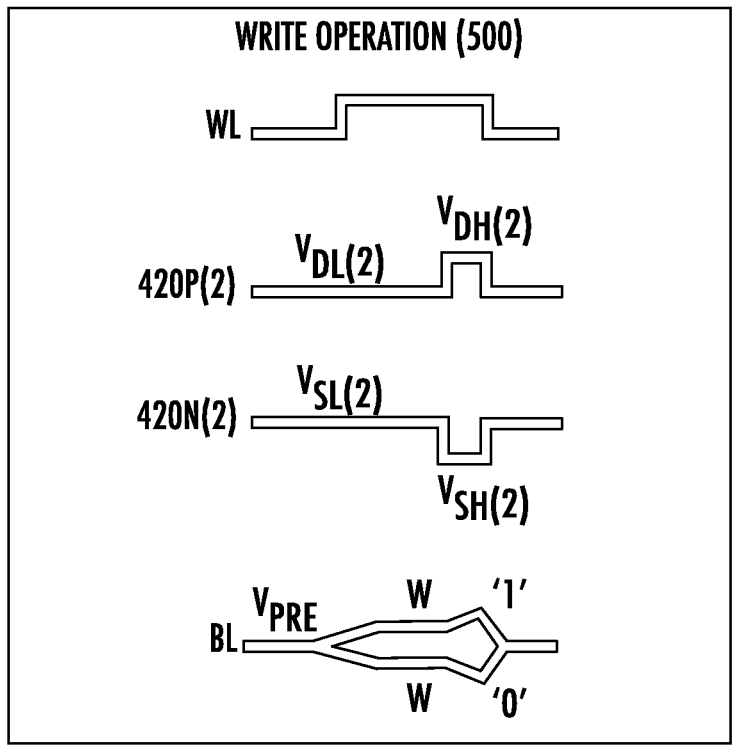
FIG. 5 is a signal diagram for a write operation in the CIM circuit in FIG. 4.

Thus, in this example, the positive and negative supply voltages $V_{DL(2)}$, $V_{SL(2)}$ supplied to the complement inverter circuit 418C in the 5T SRAM bit cell circuit 404 can be boosted in a write operation to provide write assist to avoid or reduce the risk of write contention in the 5T SRAM bit cell circuit 404. This is shown by example in the write timing diagram 500 in FIG. 5. As shown therein, for a write operation, the bit line BL is pre-charged to a write voltage $V_{PRE}$ to achieve a logic '0' or '1' write operation. The word line WL is asserted to activate the access circuit 440. The supply voltages on the respective second positive and negative supply voltage rails 420P(2), 420N(2) powering the complement inverter circuit 418C are initially the lower supply voltage $V_{DL(2)}$, $V_{SL(2)}$ that is coupled to the first positive supply voltage rail 420P(1) and first negative supply voltage rail 420N(1) powering the true inverter circuit 418T. However, as shown in FIG. 5, the supply voltages $V_{DL(2)}$, $V_{SL(2)}$ on the respective second positive and negative supply voltage rails 420P(2), 420N(2) can be positively and negatively boosted, respectively, to positive (i.e., greater in voltage) and negative (i.e., lesser in voltage) boosted supply voltages $V_{DH(2)}$, $V_{SH(2)}$, respectively, in response to the falling edge of the word line WL. The supply voltages on the respective second positive and negative supply voltage rails 420P(2), 420N(2) are boosted (increased and reduced in voltage, respectively) over respective lower supply voltages $V_{DL(2)}$, $V_{SL(2)}$ in a write operation to provide a write assist to the complement inverter circuit 418C to avoid a write contention issue to the true storage node 426T.

Additional dynamic power is expended in the voltage boost, but otherwise during standby times and when multiplications operations are performed, the lower supply voltages $V_{DL(2)}$, $V_{SL(2)}$ can be used to power the CIM circuit 400. A machine-learning application may involve many more read operations than write operations to the CIM circuit 400. Thus, boosting the supply voltages $V_{DL(2)}$, $V_{SL(2)}$ to the boosted supply voltages $V_{DH(2)}$, $V_{SH(2)}$ to the complement inverter circuit 418C in the 5T SRAM bit cell circuit 404 of the CIM circuit 400 for a write operation may not have a significant impact on the overall power consumption in the CIM circuit 400.

Figure 6:
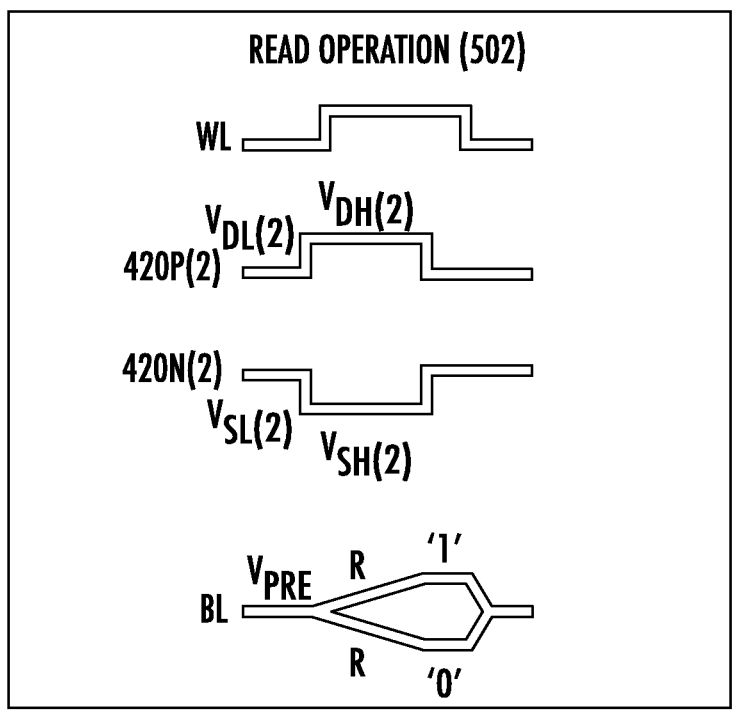
FIG. 6 is a signal diagram for a read operation in the CIM circuit in FIG. 4.

If desired, the supply voltages $V_{DL(2)}$, $V_{SL(2)}$ supplied to the complement inverter circuit 418C in the 5T SRAM bit cell circuit 404 in the CIM circuit 400 can also optionally be boosted in a read (multiplication) operation to provide read assist to the 5T SRAM bit cell circuit 404. Providing read assist can make a read operation to the SRAM bit cell circuit 404 faster thus expending less dynamic power in a multiplication operation in the CIM circuit 400. This is shown by example in the read timing diagram 502 in FIG. 6. As shown therein, for a read (i.e., multiplication) operation, the word line WL is asserted to activate the access circuit 440 of the desired CIM circuit 400. The supply voltage on the second positive and negative supply voltage rails 420P(2), 420N(2) powering the complement inverter circuit 418C is initially the lower supply voltage $V_{DL(2)}$, $V_{SL(2)}$ that is coupled to the respective first positive supply voltage rail 420P(1) and first negative supply voltage rail 420N(1) in this example powering the true inverter circuit 418T. However, as shown in FIG. 6, the supply voltage on the second positive and negative supply voltage rails 420P(2), 420N(2) can be positively and negatively boosted to boosted supply voltages $V_{DH(2)}$, $V_{SH(2)}$, respectively, in response to the rising edge of the assertion of the word line. In this regard, the supply voltage on the second positive supply voltage rail 420P(2) can be positively boosted (i.e., increased in voltage) to boosted supply voltage $V_{DH(2)}$ to exceed (i.e., be greater than) the supply voltage $V_{DL(1)}$ in this example. The supply voltage on the second negative supply voltage rail 420N(2) can be negatively boosted (i.e., reduced in voltage) to boosted supply voltage $V_{SH(2)}$ to negatively exceed (i.e., be lower than) the supply voltage $V_{SL(1)}$ in this example. The supply voltages on the second positive supply voltage rail 420P(2) and second negative supply voltage rail 420N(2) can be positively boosted (i.e., increased in voltage) and negatively boosted (i.e., reduced in voltage) to boosted supply voltages $V_{DH(2)}$, $V_{SH(2)}$, respectively, in response to the falling edge of the word line WL to provide a read assist.

Figure 7:
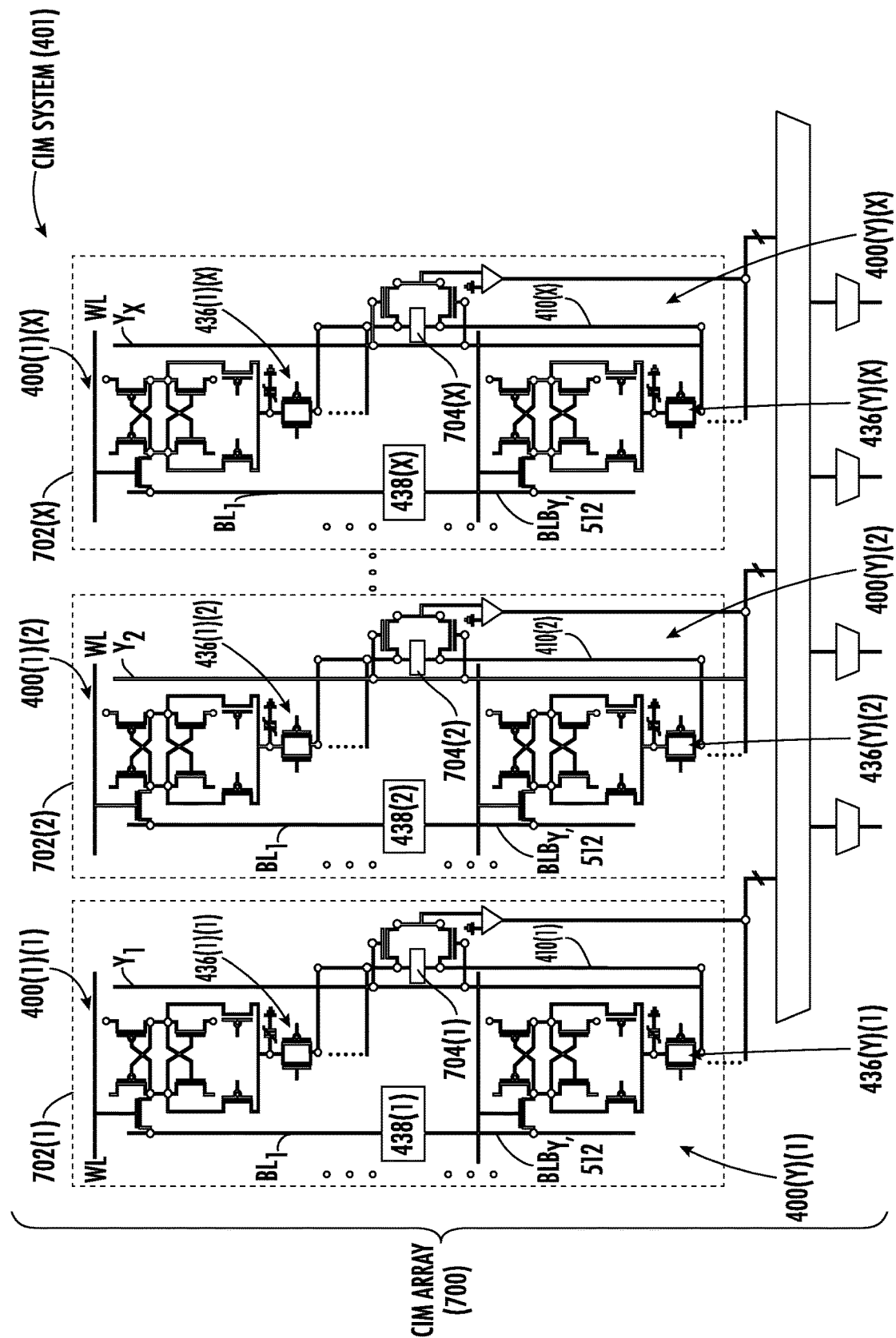
FIG. 7 is an exemplary CIM system that includes a plurality of CIM array circuits each comprising a plurality of the CIM circuits in FIG. 4, wherein each CIM circuit is configured to apply a charge representing a multiplication output to a respective global bit line to be accumulated as a MAC operation, and wherein each CIM column array circuit includes a bit line driver circuit configured to drive the bit lines of their respective CIM array circuits at a reduced voltage to reduce dynamic power.

As discussed above, the CIM system 401 can include a plurality of the CIM circuits 400 to provide a memory array. In this regard, FIG. 7 illustrates the CIM system 401 that includes a CIM array 700 that includes a plurality of CIM column array circuits 702(1)-702(X). Each one or more respective CIM column array circuit 702(1)-702(X) includes a plurality of CIM circuits 400. For example, the CIM array 700 includes CIM circuits 400(1)(1)-400(Y)(X), where 'X' is the number of CIM column array circuits 702(1)-702(X), and 'Y' is the row of the CIM circuit 400 in a given CIM column array circuit 702(1)-702(X). As shown in FIG. 7, each CIM column array circuit 702(1)-702(X) has its own dedicated bit line driver circuit 438(1)-438(X) configured to drive its respective bit line $BL_1$-$BL_x$.

As shown in FIG. 7, in another example, to reduce the line capacitance of the bit lines $BL_1$-$BL_x$ coupled to the CIM circuits 400(1)( )-400(Y)) in a given CIM column array circuit 702(1)-702(X), the bit line driver circuits 438(1)-438(X) that pre-charge the respective bit line $BL_1$-$BL_x$ for a write operation can be physically located between the end CIM circuits 400(1)( ), 400(Y)( ) in its respective CIM column array circuit 702(1)-702(X). For example, the bit line driver circuits 438(1)-438(X) can be physically located in the middle of each respective CIM column array circuit 702(1)-702(X) to reduce the distance between the bit line driver circuit 438(1)-438(X) and the farthest away, end CIM circuits 400(1)( ), 400(Y)( ) in their respective CIM column array circuit 702(1)-702(X). As an example, if 'X' is equal to 512, bit lines $BL_1$-$BL_{256}$ can be provided to half of the CIM circuits 400(1)( )-400(Y/2) in a CIM column array circuit 702(1)-702(X) that is driven by respective bit line driver circuits 438(1)-438(X). Complement bit lines $BLB_{257}$-$BLB_{Y,512}$ can be driven the respective bit line driver circuit 438(1)-438(X) to a second half of the CIM circuits 400(Y/2+1)-400(Y). In this manner, the two bit lines BL and BLB each have a length that is reduced in approximately half versus a single bit line coupled to all of the CIM circuits 400(1)( ), 400(Y)( ) in the given CIM column array circuit 702(1)-702(X). This allows the length of the bit lines BL, BLB driven by the bit line driver circuits 438(1)-438(X) to be reduced, thus reducing the line capacitance of the respective bit lines BL, BLB. Reducing the line capacitance in the bit lines BL, BLB reduces the time to pre-charge the bit lines BL, BLB to the pre-charge voltage, thus reducing dynamic power expended to pre-charge the bit lines BL, BLB for the CIM circuits 400(1)(1), 400(Y)(X).

In another exemplary aspect, as also shown in FIG. 7, a global bit line (GBL) driver circuit 704(1)-704(X) is provided and used to pre-charge the GBLs 410(1)-410(X) for the respective CIM column array circuit 702(1)-702(X). The GBL driver circuits 704(1)-704(X) are each configured to drive a pre-charge voltage on respective YL lines in each CIM column array circuit 702(1)-702(X), wherein each YL line is coupled to the transmission gates 436 of the CIM circuits 400 in a respective CIM column array circuit 702(1)-702(X). The GBLs 410(1)-410(X) are pre-charged to activate the transmission gates 436 of the CIM circuits 400 in a respective CIM column array circuit 702(1)-702(X) to perform a MAC operation in the respective CIM column array circuit 702(1)-702(X). In this manner, the CIM circuits 400(1)( ), 400(Y)( ) for a given CIM column array circuit 702(1)-702(X) can be activated to perform their multiplications on their respective multiplication outputs 412 and be asserted on their respective GBL 410(1)-410(X) to be accumulated. The GBL driver circuits 704(1)-704(X) can be configured to pre-charge their respective GBLs 410(1)-410(X) at a reduced supply voltage (e.g., $V_{DD}/2$) to further reduce dynamic power if desired. Column select lines $Y_1$-$Y_x$ are also provided for each CIM column array circuit 702(1)-702(X) and coupled to the transmission gates 436(1)( )-436($Y_x$) in a given CIM circuit 400(l)( ), 400($Y_x$) to activate the CIM column array circuit 702(1)-702(X) for a MAC operation.

Figure 8:
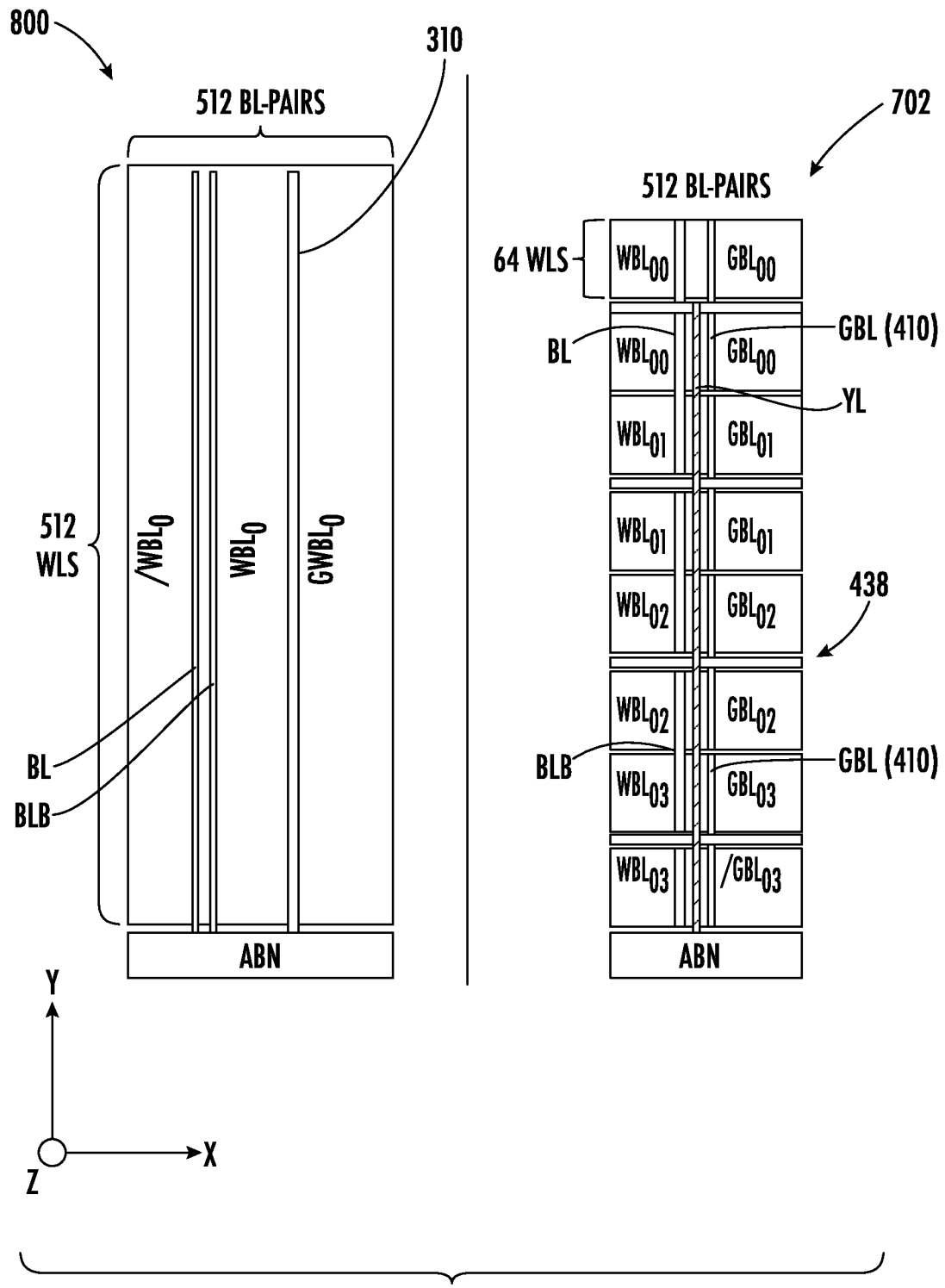
FIG. 8 is a diagram of an exemplary layout of bit lines and global bit lines of a CIM array circuit in FIG. 7.

Also, as shown in FIG. 8, by the CIM circuits 400(1)(1), 400(Y)(X) not having a complement bit line for their respective SRAM bit cell circuits 404, there is more room in the X-axis direction to provide room for the column select lines $Y_1$-$Y_x$ in each CIM column array circuit 702(1)-702 (X). This is as compared to the line layout 800 if the 6T SRAM bit cell circuit 304 in FIG. 3 were employed in the CIM column array circuit 702(1)-702(X).

Figure 9:
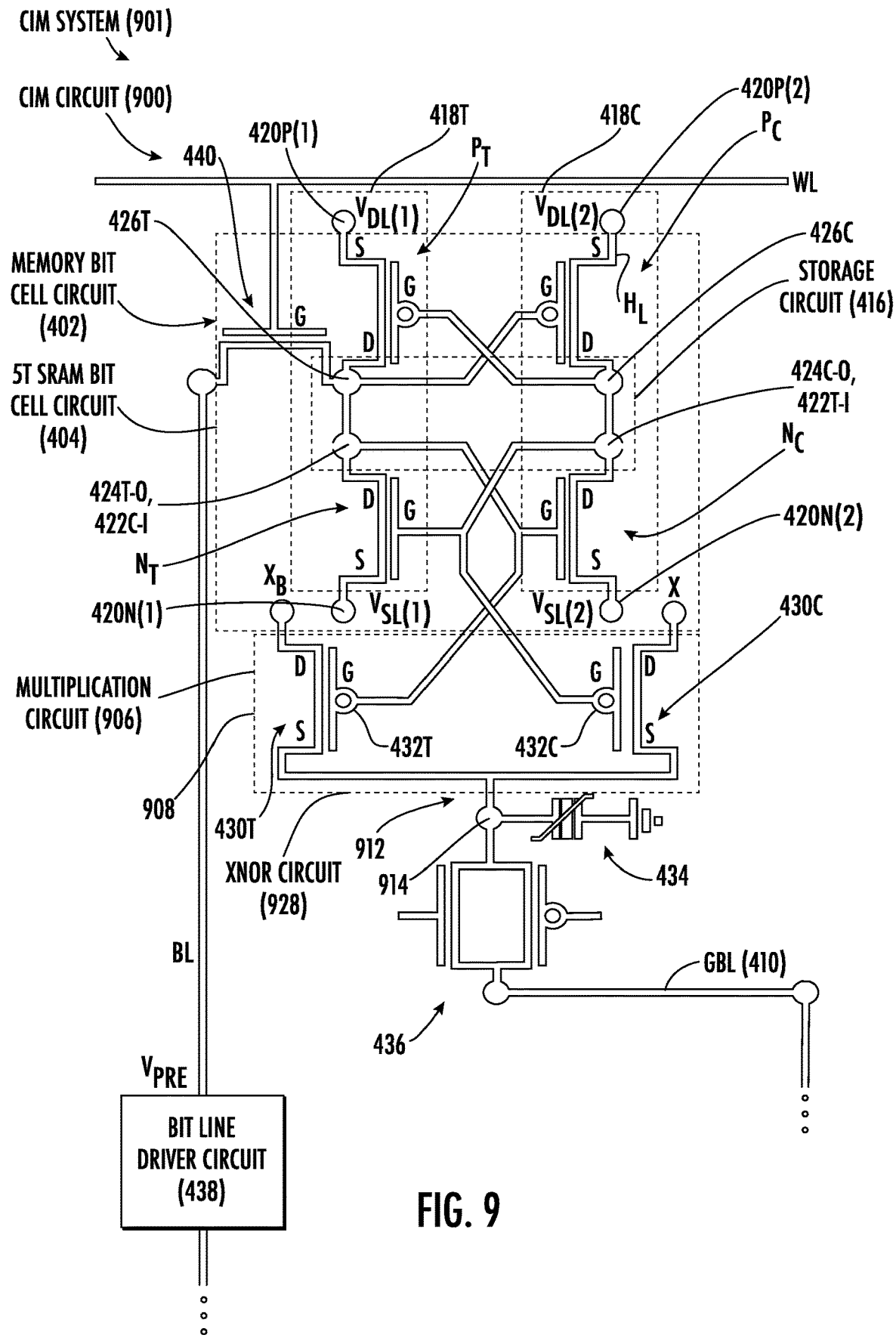
FIG. 9 is a diagram of another exemplary CIM circuit like the CIM circuit in FIG. 4, but with access circuits of the multiplication circuit coupled to the storage nodes of the 5T SRAM bit cell circuit therein.

FIG. 9 is a diagram of another exemplary CIM circuit 900 like the CIM circuit 400 in FIG. 4. The CIM circuit 900 can be provided in a CIM system 901 like described in FIGS. 4 and 7. In the CIM circuit 900 in FIG. 9, a multiplication circuit 906 is provided similar to the multiplication circuit 406 in FIG. 4. Common components between the CIM circuit 900 in FIG. 9 and the CIM circuit 400 in FIG. 4 are shown with the same element numbers, and will not be re-described. However, in FIG. 9, the gates G of the true and complement PFETs 430T, 430C are coupled to the respective complement and true storage nodes 426C, 426T. The drains D of the true and complement PFETs 430T, 430C are coupled to the true and complement multiplication input nodes 432T, 432C.

To perform a multiplication operation of storage data in the storage circuit 416 in the 5T SRAM bit cell circuit 404 in the CIM circuit 900 in FIG. 9, an XOR-based circuit 908 in the form of an XNOR circuit 928 in this example is configured to perform an XNOR operation. The true and complement multiplication input nodes 432T, 432C of the true and complement PFETs 430T, 430C are configured to receive respective input signals represented as input data X and $X_B$. The gates G of the true and complement PFETs 430T, 430C are configured to receive the true and complement storage data on the true and complement storage nodes 426T, 426C. The storage data at only one of the true and complement storage nodes 426T, 426C is passed by the respective PFETs 430T, 430C of the XNOR circuit 928 to a multiplication output node 914 at a time, because only one of the PFETs 430T, 430C will be active at a time based on complement voltages between the true and complement storage nodes 426T, 426C. The XNOR circuit 928 is configured perform an XNOR operation between the true input signal X and $X_B$ and the storage data on the true and complement storage nodes 426T, 426C to generate the multiplication output 912 on the multiplication output node 914.

Note that when a first coupling is referenced to a source/drain of a FET and a second coupling is referenced to a drain/source of the same FET, this means that either a source is involved in the first coupling, and the drain is involved in the second coupling, or the drain is involved in the first coupling, and the source is involved in the second coupling.

A CIM system that includes one or more CIM circuits that each include a 5T SRAM bit cell circuit configured to be coupled to a single bit line for a read and write operation and configured to be operated at a reduced supply voltage to reduce standby and dynamic power, and further include an XOR-based circuit for generating a multiplication output representing a multiplication operation of a read stored data value as storage data in the SRAM bit cell circuit with an input data value, including, but not limited to, the CIM circuits in FIGS. 4 and 7-10 and according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
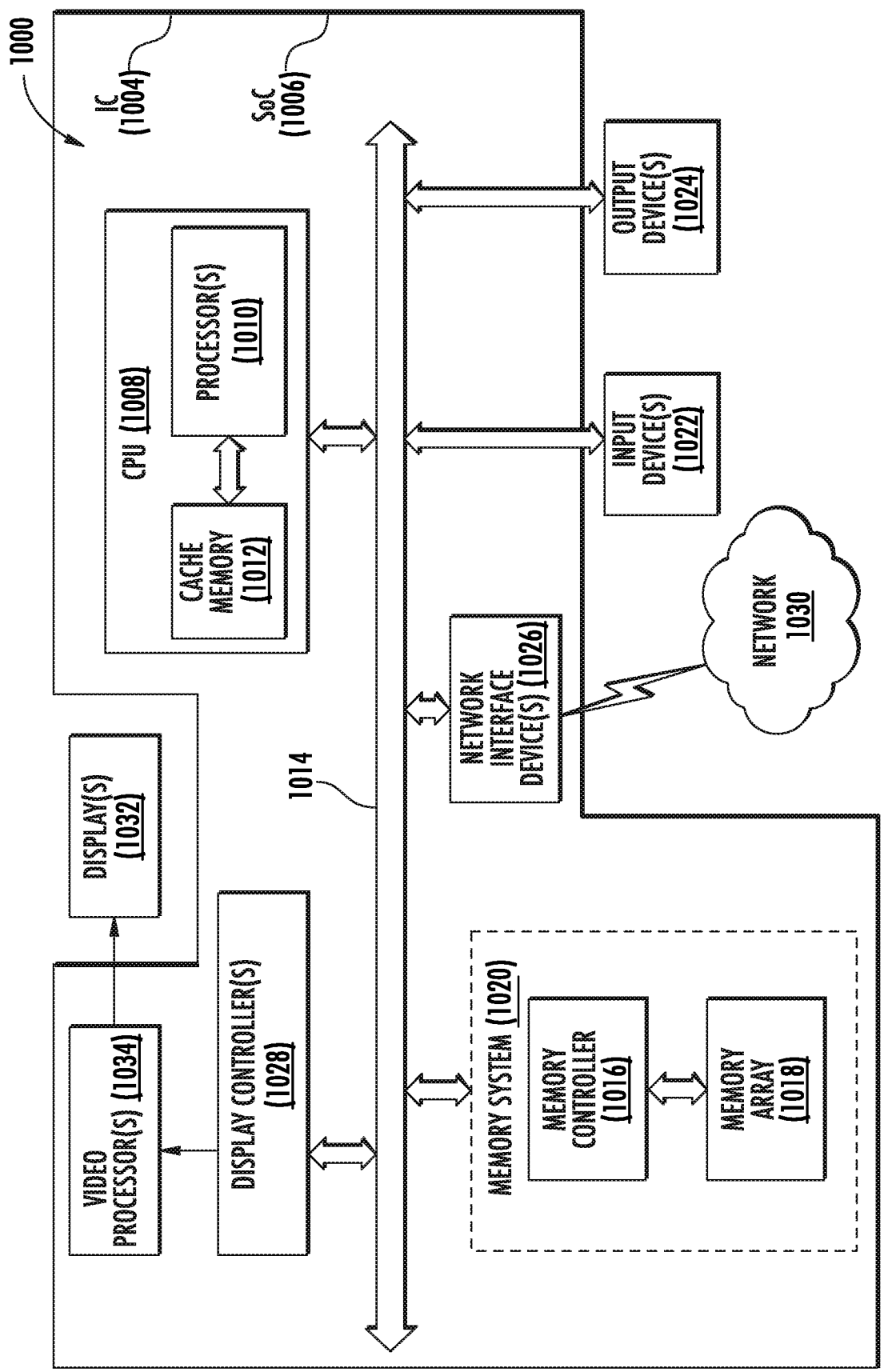
FIG. 10 is a block diagram of an exemplary processor-based system that can include a CIM system that includes one or more CIM circuits that each include a 5T SRAM bit cell circuit configured to be coupled to a single bit line and a multiplication circuit in the form of an XOR-based circuit for generating a multiplication output representing a multiplication operation of an input data value with a storage data value in the 5T SRAM bit cell circuit with an input data value, wherein the CIM circuit is configured to be operated at a reduced supply voltage to reduce standby and dynamic power, including, but not limited to, the CIM circuits in FIGS. 4 and 7-9.

In this regard, FIG. 10 illustrates an example of a processor-based system 1000 that includes a CIM system that includes one or more CIM circuits that each include a 5T SRAM bit cell circuit configured to be coupled to a single bit line for a read and write operation and configured to be operated at a reduced supply voltage to reduce standby and dynamic power, and further include an XOR-based circuit for generating a multiplication output representing a multi-plication operation of a read stored data value as storage data in the SRAM bit cell circuit with an input data value, including, but not limited to, the CIM circuits in FIGS. 4 and 7-9 and according to any aspects disclosed herein. In this example, the processor-based system 1000 may be formed as an integrated circuit (IC) 1004 as a system-on-a-chip (SoC) 1006. The processor-based system 1000 includes a central processing unit (CPU) 1008 that includes one or more processors 1010, which may also be referred to as CPU cores or processor cores. The CPU 1008 may have a cache memory 1012 coupled to the CPU 1008 for rapid access to temporarily stored data. The cache memory 1012 may include a CIM system that includes one or more CIM circuits that each include a 5T SRAM bit cell circuit configured to be coupled to a single bit line for a read and write operation and configured to be operated at a reduced supply voltage to reduce standby and dynamic power, and further include an XOR-based circuit for generating a multiplication output representing a multiplication operation of a read stored data value as storage data in the SRAM bit cell circuit with an input data value, including, but not limited to, the CIM circuits in FIGS. 4 and 7-9, and according to any aspects disclosed herein The CPU 1008 is coupled to a system bus 1014 that can intercouple master and slave devices included in the processor-based system 1000. As is well known, the CPU 1008 communicates with these other devices by exchanging address, control, and data information over the system bus 1014. For example, the CPU 1008 can communicate bus transaction requests to a memory controller 1016 as an example of a slave device. Although not illustrated in FIG. 10, multiple system buses 1014 could be provided, wherein each system bus 1014 constitutes a different fabric.

Other master and slave devices can be connected to the system bus 1014. As illustrated in FIG. 10, these devices can include a memory system 1020 that includes the memory controller 1016 and a memory array(s) 1018, one or more input devices 1022, one or more output devices 1024, one or more network interface devices 1026, and one or more display controllers 1028, as examples. Each of the memory system 1020, the one or more input devices 1022, the one or more output devices 1024, the one or more network interface devices 1026, and the one or more display controllers 1028 may include a CIM system that includes one or more CIM circuits that each include a 5T SRAM bit cell circuit configured to be coupled to a single bit line for a read and write operation and configured to be operated at a reduced supply voltage to reduce standby and dynamic power, and further include an XOR-based circuit for generating a multiplication output representing a multiplication operation of a read stored data value as storage data in the SRAM bit cell circuit with an input data value, including, but not limited to, the CIM circuits in FIGS. 4 and 7-9 and according to any aspects disclosed herein.

The input device(s) 1022 can include any type of input device, including, but not limited to, input keys, switches, voice processors, etc. The output device(s) 1024 can include any type of output device, including, but not limited to, audio, video, other visual indicators, etc. The network interface device(s) 1026 can be any device configured to allow exchange of data to and from a network 1030. The network 1030 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1026 can be configured to support any type of communications protocol desired.

The CPU 1008 may also be configured to access the display controller(s) 1028 over the system bus 1014 to control information sent to one or more displays 1032. The display controller(s) 1028 sends information to the display(s) 1032 to be displayed via one or more video processors 1034, which process the information to be displayed into a format suitable for the display(s) 1032. The display(s) 1032 can include any type of display, including, but not limited to, a cathode ray tube (CRT), a liquid crystal display (LCD), a plasma display, a light emitting diode (LED) display, etc. The display controller(s) 1028, video processor(s) 1034, and display 1032 can include a CIM system that includes one or more CIM circuits that each include a 5T SRAM bit cell circuit configured to be coupled to a single bit line for a read and write operation and configured to be operated at a reduced supply voltage to reduce standby and dynamic power, and further include an XOR-based circuit for generating a multiplication output representing a multiplication operation of a read stored data value as storage data in the SRAM bit cell circuit with an input data value, including, but not limited to, the CIM circuits in FIGS. 4 and 7-9 and according to any aspects disclosed herein.

Figure 11:
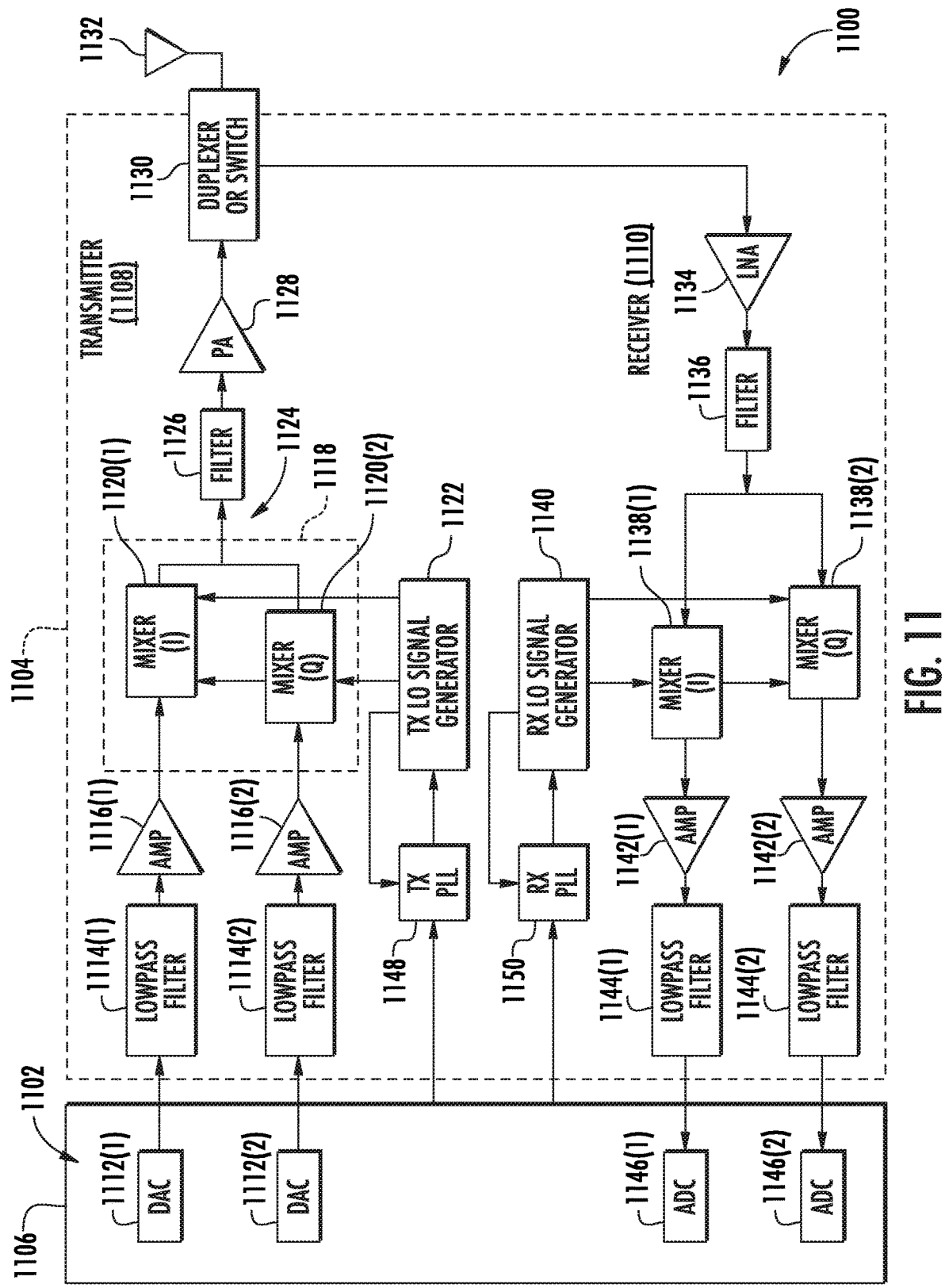
FIG. 11 is a block diagram of an exemplary wireless communications device that includes radio frequency (RF) components and includes a CIM system that includes one or more CIM circuits that each include a 5T SRAM bit cell circuit configured to be coupled to a single bit line and a multiplication circuit in the form of an XOR-based circuit for generating a multiplication output representing a multiplication operation of an input data value with a storage data value in the 5T SRAM bit cell circuit with an input data value, wherein the CIM circuit is configured to be operated at a reduced supply voltage to reduce standby and dynamic power, including, but not limited to, the CIM circuits in FIGS. 4 and 7-9.

FIG. 11 illustrates an exemplary wireless communications device 1100 that includes radio frequency (RF) components formed from one or more ICs 1102, wherein any of the ICs 1102 can include a CIM system that includes one or more CIM circuits that each include a 5T SRAM bit cell circuit configured to be coupled to a single bit line for a read and write operation and configured to be operated at a reduced supply voltage to reduce standby and dynamic power, and further include an XOR-based circuit for generating a multiplication output representing a multiplication operation of a read stored data value as storage data in the SRAM bit cell circuit with an input data value, including, but not limited to, the CIM circuits in FIGS. 4 and 7-9, and according to any aspects disclosed herein.

As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110 that support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RF ICs (RFICs), mixed-signal ICs, etc.

The transmitter 1108 or the receiver 1110 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1112(1), 1112(2) for converting digital signals generated by the data processor 1106 into I and Q analog output signals, e.g., I and Q output currents, for further processing.

Within the transmitter 1108, lowpass filters 1114(1), 1114(2) filter the I and Q analog output signals, respectively, to remove undesired signals caused by the prior digital-to-analog conversion. Amplifiers (AMPs) 1116(1), 1116(2) amplify the signals from the lowpass filters 1114(1), 1114(2), respectively, and provide I and Q baseband signals. An upconverter 1118 upconverts the I and Q baseband signals with I and Q transmit (TX) local oscillator (LO) signals from a TX LO signal generator 1122 through mixers 1120(1), 1120(2) to provide an upconverted signal 1124. A filter 1126 filters the upconverted signal 1124 to remove undesired signals caused by the frequency upconversion as well as noise in a receive frequency band. A power amplifier (PA) 1128 amplifies the upconverted signal 1124 from the filter 1126 to obtain the desired output power level and provides a transmit RF signal. The transmit RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Down-conversion mixers 1138(1), 1138(2) mix the output of the filter 1136 with I and Q RX LO signals (i.e., LO_I and LO_Q) from an RX LO signal generator 1140 to generate I and Q baseband signals. The I and Q baseband signals are amplified by AMPs 1142(1), 1142(2) and further filtered by lowpass filters 1144(1), 1144(2) to obtain I and Q analog input signals, which are provided to the data processor 1106. In this example, the data processor 1106 includes analog-to-digital converters (ADCs) 1146(1), 1146(2) for converting the analog input signals into digital signals to be further processed by the data processor 1106.

In the wireless communications device 1100 of FIG. 11, the TX LO signal generator 1122 generates the I and Q TX LO signals used for frequency upconversion, while the RX LO signal generator 1140 generates the I and Q RX LO signals used for frequency downconversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired.

To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A compute-in-memory (CIM) circuit, comprising:
 a bit line;
 a static random access memory (SRAM) bit cell circuit, comprising:
  a storage circuit, comprising:
   a true inverter circuit comprising a true inverter input node and a true inverter output node comprising a true storage node; and
   a complement inverter circuit comprising a complement inverter input node coupled to the true inverter output node, and a complement inverter output node comprising a complement storage node coupled only to the true inverter input node; and
  an access circuit coupled to the true storage node; and
 a multiplication circuit comprising a first multiplication input node coupled to the storage circuit, a second multiplication input node, and a multiplication output node;
 the multiplication circuit configured to generate on the multiplication output node, a multiplication product of a first multiplication input on the first multiplication input node and a second multiplication input on the second multiplication input node.

2. The CIM circuit of claim 1, further not comprising a second access circuit coupled to the complement storage node.

3. The CIM circuit of claim 2, further not comprising a second bit line coupled to the SRAM bit cell circuit.

4. The CIM circuit of claim 1, wherein the multiplication circuit comprises an exclusive OR (XOR)-based circuit configured to generate the multiplication product on the multiplication output node as an XOR-based logic operation of the first multiplication input and the second multiplication input.

5. The CIM circuit of claim 4, wherein:
 the first multiplication input node comprises:
  a first true multiplication input node coupled to the true storage node and configured to receive true storage data on the true storage node; and
  a first complement multiplication input node coupled to the complement storage node and configured to receive complement storage data on the complement storage node;
 the second multiplication input node comprises:
  a second true multiplication input node configured to receive a second true multiplication input data; and
  a second complement multiplication input node configured to receive a second complement multiplication input data; and
 the XOR-based circuit comprises:
  a first multiplication transistor, comprising:
   a first source/drain coupled to the first true multiplication input node;
   a first drain/source coupled to the multiplication output node; and
   a first gate coupled to the second true multiplication input node; and
  a second multiplication transistor, comprising:
   a second source/drain coupled to the first complement multiplication input node;

a second drain/source coupled to the multiplication output node; and
a second gate coupled to the second complement multiplication input node.

6. The CIM circuit of claim 4, wherein:
the first multiplication input node comprises:
a first true multiplication input node coupled to the true storage node and configured to receive true storage data on the true storage node; and
a first complement multiplication input node coupled to the complement storage node and configured to receive complement storage data on the complement storage node;
the second multiplication input node comprises:
a second true multiplication input node configured to receive a second true multiplication input data; and
a second complement multiplication input node configured to receive a second complement multiplication input data; and
the XOR-based circuit comprises:
a first multiplication transistor, comprising:
a first source/drain coupled to the second true multiplication input node;
a first drain/source coupled to the multiplication output node; and
a first gate coupled to the first true multiplication input node; and
a second multiplication transistor, comprising:
a second source/drain coupled to the second complement multiplication input node;
a second drain/source coupled to the multiplication output node; and
a second gate coupled to the first complement multiplication input node.

7. The CIM circuit of claim 1, further comprising a non-volatile (NV) capacitor circuit coupled to the multiplication output node.

8. The CIM circuit of claim 7, wherein the NV capacitor circuit comprises a ferroelectric capacitor circuit.

9. The CIM circuit of claim 1, wherein:
the bit line is configured to be pre-charged to a pre-charge voltage; and
the access circuit is configured to pass a data value on the true storage node to the bit line in response to the access circuit being activated.

10. The CIM circuit of claim 1, further comprising:
a first supply voltage rail coupled to the true inverter circuit, the first supply voltage rail configured to receive a first supply voltage; and
a second supply voltage rail coupled to the complement inverter circuit, the second supply voltage rail configured to receive a second supply voltage;
the second supply voltage rail configured to provide a boosted voltage based on the second supply voltage in response to the access circuit being activated to perform an access operation to the SRAM bit cell circuit, the boosted voltage exceeding the first supply voltage.

11. The CIM circuit of claim 1, further comprising:
a first positive supply voltage rail configured to receive a first positive supply voltage;
a second positive supply voltage rail configured to receive a second positive supply voltage;
a first negative supply voltage rail configured to receive a first ground voltage; and
a second negative supply voltage rail configured to receive a second ground voltage;
wherein the true inverter circuit comprises:
a true positive (P)-type field-effect transistor (FET) (PFET), comprising:
a true P-type source coupled to the first positive supply voltage rail;
a true P-type gate coupled to the complement inverter output node; and
a true P-type drain coupled to the complement inverter input node; and
a true negative (N)-type FET (NFET), comprising:
a true N-type drain coupled to the first negative supply voltage rail;
a true N-type gate coupled to the complement inverter output node; and
a true N-type source coupled to the complement inverter input node; and
the complement inverter circuit comprises:
a complement PFET, comprising:
a complement P-type source coupled to the second positive supply voltage rail;
a complement P-type gate coupled to the true inverter output node; and
a complement P-type drain coupled to the true inverter input node; and
a complement NFET, comprising:
a complement N-type drain coupled to the second negative supply voltage rail;
a complement N-type gate coupled to the true inverter output node; and
a complement N-type source coupled to the true inverter input node.

12. The CIM circuit of claim 11, wherein the second positive supply voltage rail is coupled to the first positive supply voltage rail.

13. The CIM circuit of claim 11, wherein:
the second positive supply voltage rail is configured to provide a positive boosted voltage based on the second positive supply voltage in response to the access circuit being activated to perform an access operation to the SRAM bit cell circuit, the positive boosted voltage exceeding the first positive supply voltage; and
the second negative supply voltage rail is configured to provide a negative boosted voltage based on the second ground voltage in response to the access circuit being activated to perform the access operation to the SRAM bit cell circuit, the negative boosted voltage negatively exceeding the first ground voltage.

14. The CIM circuit of claim 1, wherein the SRAM bit cell circuit is a five-transistor (5T) SRAM bit cell circuit.

15. The CIM circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

16. The CIM circuit of claim 1 integrated in an integrated circuit (IC).

17. A method of performing a compute-in-memory (CIM) operation, comprising:

activating an access circuit to couple a bit line to a true storage node of a true inverter circuit of a static random access memory (SRAM) bit cell circuit, the SRAM bit cell circuit comprising:
  the true inverter circuit comprising a true inverter input node and a true inverter output node comprising the true storage node; and
  a complement inverter circuit comprising a complement inverter input node coupled to the true inverter output node, and a complement inverter output node comprising a complement storage node coupled only to the true inverter input node;
providing a true data value from the true storage node as a first multiplication input to a first multiplication input node of a multiplication circuit;
asserting a second multiplication input to a second multiplication input node of the multiplication circuit; and
generating a multiplication product on a multiplication output node of the multiplication circuit based on a multiplication of the first multiplication input and the second multiplication input.

18. The method of claim 17, further comprising:
providing a first positive supply voltage of a first positive supply voltage rail to the true inverter circuit;
providing a second positive supply voltage of a second positive supply voltage rail to the complement inverter circuit; and
positively boosting the second positive supply voltage to exceed the first positive supply voltage in response to the access circuit being activated.

19. The method of claim 18, further comprising:
providing a first ground voltage of a first negative supply voltage rail to the true inverter circuit;
providing a second ground voltage of a second negative supply voltage rail to the complement inverter circuit; and
negatively boosting the second ground voltage to negatively exceed the first ground voltage in response to the access circuit being activated.

20. The method of claim 17, further comprising:
providing a memory domain supply voltage to a memory array in a processor-based system;
providing a first supply voltage to the true inverter circuit less than the memory domain supply voltage; and
providing a second supply voltage to the complement inverter circuit.

21. The method of claim 20, further comprising pre-charging the bit line to the first supply voltage.

22. A memory system, comprising:
a compute-in-memory (CIM) array circuit comprising a plurality of CIM circuits each comprising:
  a static random access memory (SRAM) bit cell circuit, comprising:
    a storage circuit, comprising:
      a true inverter circuit comprising a true inverter input node and a true inverter output node comprising a true storage node; and
      a complement inverter circuit comprising a complement inverter input node coupled to the true inverter output node, and a complement inverter output node comprising a complement storage node coupled only to the true inverter input node; and
    an access circuit coupled to the true storage node; and
  a multiplication circuit comprising a first multiplication input node coupled to the storage circuit, a second multiplication input node, and a multiplication output node;
  the multiplication circuit configured to generate on the multiplication output node, a multiplication product of a multiplication of a first multiplication input on the first multiplication input node and a second multiplication input on the second multiplication input node;
a first bit line coupled to each of the access circuits of a first subset of the plurality of CIM circuits;
a second bit line coupled to each of the access circuits of a second subset of the plurality of CIM circuits different from the first subset of the plurality of CIM circuits; and
a bit line driver circuit coupled to the first bit line and the second bit line;
the bit line driver circuit configured to:
  pre-charge the first bit line to a first pre-charge voltage of true read data; and
  pre-charge the second bit line to a second pre-charge voltage of complement read data.

23. The memory system of claim 22, wherein the bit line driver circuit is physically located in the CIM array circuit between a first end CIM circuit among the first subset of the plurality of CIM circuits and a second end CIM circuit among the second subset of the plurality of CIM circuits.

24. The memory system of claim 22, wherein:
a number of CIM circuits in the first subset of the plurality of CIM circuits is equal to a number of CIM circuits in the second subset of the plurality of CIM circuits;
the first subset of the plurality of CIM circuits is arranged in a first linear array;
the second subset of the plurality of CIM circuits is arranged in a second linear array aligned with the first linear array; and
the bit line driver circuit is physically located in an area between the first linear array and the second linear array.

25. The memory system of claim 22, wherein:
the CIM array circuit further comprises a global bit line (GBL); and
each of the multiplication output nodes of the plurality of CIM circuits in the CIM array circuit is coupled to the GBL.

26. The memory system of claim 25, wherein the CIM array circuit further comprises a global bit line driver circuit configured to pre-charge the GBL to a pre-charge voltage.

27. The memory system of claim 26, further comprising a memory array, wherein:
the memory array is configured to receive a memory domain supply voltage; and
the global bit line driver circuit is configured to pre-charge the GBL to the pre-charge voltage less than the memory domain supply voltage.

* * * * *

UNITED STATES PATENT AND TRADEMARK OFFICE
CERTIFICATE OF CORRECTION

| | | |
|---|---|---|
| PATENT NO. | : 11,176,991 B1 | Page 1 of 1 |
| APPLICATION NO. | : 17/084779 | |
| DATED | : November 16, 2021 | |
| INVENTOR(S) | : Khaja Ahmad Shaik et al. | |

It is certified that error appears in the above-identified patent and that said Letters Patent is hereby corrected as shown below:

On the Title Page

Item (54) and in the Specification, Column 1, Line 1, Title, change "COMPUTE-IN-MEMORY (CIM) EMPLOYING LOW-POWER CIM CIRCUITS EMPLOYING STATIC RANDOM ACCESS MEMORY (SRAM) BIT CELLS, PARTICULARLY FOR MULTIPLY-AND-ACCUMLUATE (MAC) OPERATIONS" to --COMPUTE-IN-MEMORY (CIM) EMPLOYING LOW-POWER CIM CIRCUITS EMPLOYING STATIC RANDOM ACCESS MEMORY (SRAM) BIT CELLS, PARTICULARLY FOR MULTIPLY-AND-ACCUMULATE (MAC) OPERATIONS--.

Signed and Sealed this
Thirty-first Day of May, 2022

Katherine Kelly Vidal
*Director of the United States Patent and Trademark Office*